United States Patent
Min et al.

(10) Patent No.: US 10,381,265 B2
(45) Date of Patent: Aug. 13, 2019

(54) METHOD OF MANUFACTURING SEMICONDUCTOR DEVICE WITH INTERLAYER INSULATING LAYERS

(71) Applicant: Samsung Electronics Co., Ltd., Suwon-si, Gyeonggi-do (KR)

(72) Inventors: Sun-ki Min, Seoul (KR); Koung-min Ryu, Hwaseong-si (KR); Sung-soo Kim, Seoul (KR); Sang-koo Kang, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/589,169

(22) Filed: May 8, 2017

(65) Prior Publication Data

US 2017/0345712 A1 Nov. 30, 2017

(30) Foreign Application Priority Data

May 31, 2016 (KR) ........................ 10-2016-0067745

(51) Int. Cl.
*H01L 21/768* (2006.01)
*H01L 21/8238* (2006.01)
(Continued)

(52) U.S. Cl.
CPC .. *H01L 21/76828* (2013.01); *H01L 21/02164* (2013.01); *H01L 21/02323* (2013.01); *H01L 21/02337* (2013.01); *H01L 21/762* (2013.01); *H01L 21/76224* (2013.01); *H01L 21/76837* (2013.01); *H01L 21/823821* (2013.01); *H01L 29/42376* (2013.01); *H01L 29/66545* (2013.01);
(Continued)

(58) Field of Classification Search
CPC ......... H01L 21/76828; H01L 21/76224; H01L 21/76819; H01L 29/66545; H01L 21/823828; H01L 21/823821; H01L 21/823878
See application file for complete search history.

(56) References Cited

U.S. PATENT DOCUMENTS 6,344,383 B1 2/2002 Berry et al.
6,396,122 B1 5/2002 Howard et al.
(Continued)

FOREIGN PATENT DOCUMENTS

JP  H07254596 A  10/1995
JP  H11233565 A  8/1999
(Continued)

*Primary Examiner* — Thanh Y. Tran
(74) *Attorney, Agent, or Firm* — Harness, Dickey & Pierce, P.L.C.

(57) ABSTRACT

A method of manufacturing a semiconductor device includes forming first and second pattern structures on first and second regions of a substrate, respectively, forming a preparatory first interlayer insulating layer covering the first pattern structure on the first region, forming a preparatory second interlayer insulating layer covering the second pattern structure on the second region, the preparatory second interlayer insulating layer including a first colloid, and converting the preparatory first and second interlayer insulating layers into first and second interlayer insulating layers, respectively, by annealing the preparatory first and second interlayer insulating layers.

17 Claims, 39 Drawing Sheets

(51) Int. Cl.
  *H01L 29/66* (2006.01)
  *H01L 21/762* (2006.01)
  *H01L 29/423* (2006.01)
  *H01L 29/78* (2006.01)
  *H01L 21/02* (2006.01)

(52) U.S. Cl.
  CPC ...... *H01L 29/785* (2013.01); *H01L 21/82385* (2013.01); *H01L 21/823807* (2013.01); *H01L 21/823828* (2013.01)

(56) References Cited

U.S. PATENT DOCUMENTS

| | | | |
|---|---|---|---|
| 6,437,234 | B1 | 8/2002 | Kyoda et al. |
| 6,967,172 | B2 | 11/2005 | Leung et al. |
| 7,927,968 | B2 | 4/2011 | Kim et al. |
| 9,105,742 | B1 | 8/2015 | Basker et al. |
| 2009/0174041 | A1 | 7/2009 | Takeguchi |
| 2013/0208337 | A1* | 8/2013 | Lee ............ G02B 26/005 359/290 |
| 2015/0187939 | A1 | 7/2015 | Wu et al. |
| 2016/0109286 | A1* | 4/2016 | Yazaki ............ G01H 1/00 73/649 |
| 2016/0247876 | A1* | 8/2016 | Chung ............ H01L 29/0649 |
| 2016/0284706 | A1* | 9/2016 | Chung ............ H01L 27/0924 |

FOREIGN PATENT DOCUMENTS

| | | |
|---|---|---|
| JP | 2004018778 A | 1/2004 |
| JP | 3515507 B2 | 4/2004 |
| JP | 2006216793 A | 8/2006 |
| JP | 2008305871 A | 12/2008 |
| JP | 2015164150 A | 9/2015 |
| KR | 100326813 B1 | 3/2002 |
| KR | 100649817 B1 | 11/2006 |

\* cited by examiner

METHOD OF MANUFACTURING SEMICONDUCTOR DEVICE WITH INTERLAYER INSULATING LAYERS

CROSS-REFERENCE TO RELATED APPLICATION

This application claims the benefit of priority from Korean Patent Application No. 10-2016-0067745, filed on May 31, 2016, in the Korean Intellectual Property Office, the disclosure of which is incorporated herein in its entirety by reference.

BACKGROUND

The inventive concepts relate to a semiconductor device, and/or to a method of manufacturing a semiconductor device including an interlayer insulating layer.

A semiconductor device may include an interlayer insulating layer for insulation between patterns. The interlayer insulating layer may be formed to cover side surfaces and/or upper surfaces of patterns and may undergo subsequent processes such as etching, planarizing, annealing, and the like. In accordance with the recent trend of fine-sized patterns, the influence of the interlayer insulating layer on patterns has increased. Accordingly, a technology of forming an interlayer insulating layer that may be structurally stable and may improve the reliability of a device may be advantageous.

SUMMARY

The inventive concepts provide a method of manufacturing a semiconductor device including an interlayer insulating layer that may be structurally stable and may improve the reliability of a device.

According to an example embodiment of the inventive concepts, there is provided a method of manufacturing a semiconductor device including forming first and second pattern structures on first and second regions of a substrate, respectively; forming a preparatory first interlayer insulating layer covering the first pattern structure on the first region; forming a preparatory second interlayer insulating layer covering the second pattern structure on the second region, the preparatory second interlayer insulating layer including first colloid; and converting the preparatory first and second interlayer insulating layers into first and second interlayer insulating layers, respectively, by annealing the preparatory first and second interlayer insulating layers.

According to another example embodiment of the inventive concepts, there is provided a method of manufacturing a semiconductor device including forming a preparatory first interlayer insulating layer on a first region of a substrate, the preparatory first interlayer insulating layer delimiting a first pattern structure; forming a preparatory second interlayer insulating layer on the second region of the substrate, the preparatory second interlayer insulating layer delimiting the second pattern structure and including a colloid; and converting the preparatory first and second interlayer insulating layers into first and second interlayer insulating layers, respectively, by annealing the preparatory first and second interlayer insulating layers, wherein the colloid includes a dispersion medium and a dispersoid surrounding the dispersion medium, wherein the dispersion medium is the same as a material of the preparatory first interlayer insulating layer, and wherein at least one of a density and a thermal expansivity of the second interlayer insulating layer is higher than at least one of a density and a thermal expansivity of the first interlayer insulating layer.

Some example embodiments relate to a method of reducing a threshold voltage of a semiconductor device, the method including forming a pattern structure on a substrate, the pattern structure including a first pattern structure and a second pattern structure, a pattern density of the second pattern structure being lower than a pattern density of the first pattern structure, forming a first interlayer insulating layer on the first pattern structure, forming a preparatory second interlayer insulating layer on the second pattern structure, the preparatory second interlayer insulating layer including a first colloid, forming a second interlayer insulating layer by annealing the preparatory second interlayer insulating layer, and planarizing the first and second interlayer insulating layers to have upper surfaces thereof lower than upper surfaces of the first and second pattern structures. A level of the upper surface of the first interlayer insulating layer is the same as a level of the upper surface of the second interlayer insulating layer.

BRIEF DESCRIPTION OF THE DRAWINGS

Example embodiments of the inventive concepts will be more clearly understood from the following detailed description taken in conjunction with the accompanying drawings in which:

FIGS. 3A through 3G are cross-sectional views for sequentially describing a method of manufacturing a semiconductor device, according to some example embodiments, wherein FIGS. 3A through 3G are cross-sectional views taken along lines A-A and B1-B1 of FIG. 2;

FIGS. 8A through 8C are cross-sectional views for sequentially describing a method of manufacturing a semiconductor device, according to other example embodiments, wherein FIGS. 8A through 8C are cross-sectional views taken along lines A-A and B2-B2 of FIG. 7;

FIGS. 10A through 10F are cross-sectional views for sequentially describing a method of manufacturing a semiconductor device, according to other example embodiments, wherein FIGS. 10A through 10F are cross-sectional views taken along lines C-C and D-D of FIG. 9;

FIG. 13 is a cross-sectional view for describing a method of manufacturing a semiconductor device, according to other example embodiments, wherein FIG. 13 is a cross-sectional view taken along lines C-C and D-D of FIG. 9;

FIGS. 14A and 14B are cross-sectional views for sequentially describing a method of manufacturing a semiconductor device, according to other example embodiments, wherein FIGS. 14A and 14B are cross-sectional views taken along lines C-C and D-D of FIG. 9;

FIGS. 16A through 16G are cross-sectional views for sequentially describing a method of manufacturing a semiconductor device, according to other example embodiments, wherein FIGS. 16A through 16G are cross-sectional views taken along a line E-E of FIGS. 15A and 15B;

DETAILED DESCRIPTION

Figure 1:
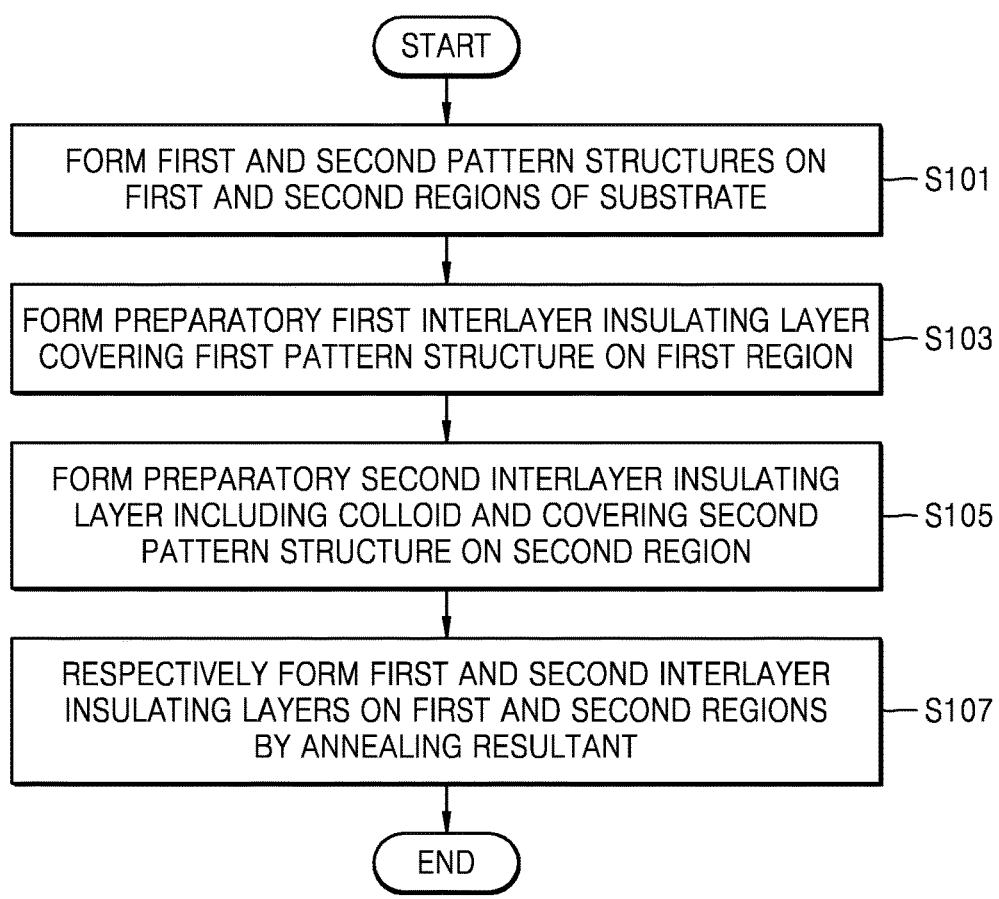
FIG. 1 is a flowchart for describing a method of manufacturing a semiconductor device, according to some example embodiments.

These and other features and advantages are described in, or are apparent from, the following detailed description of various example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

When the terms "about" or "substantially" are used in this specification in connection with a numerical value, it is intended that the associated numerical value include a tolerance of +10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

FIG. 1 is a flowchart for describing a method of manufacturing a semiconductor device, according to example embodiments.

Figure 2:
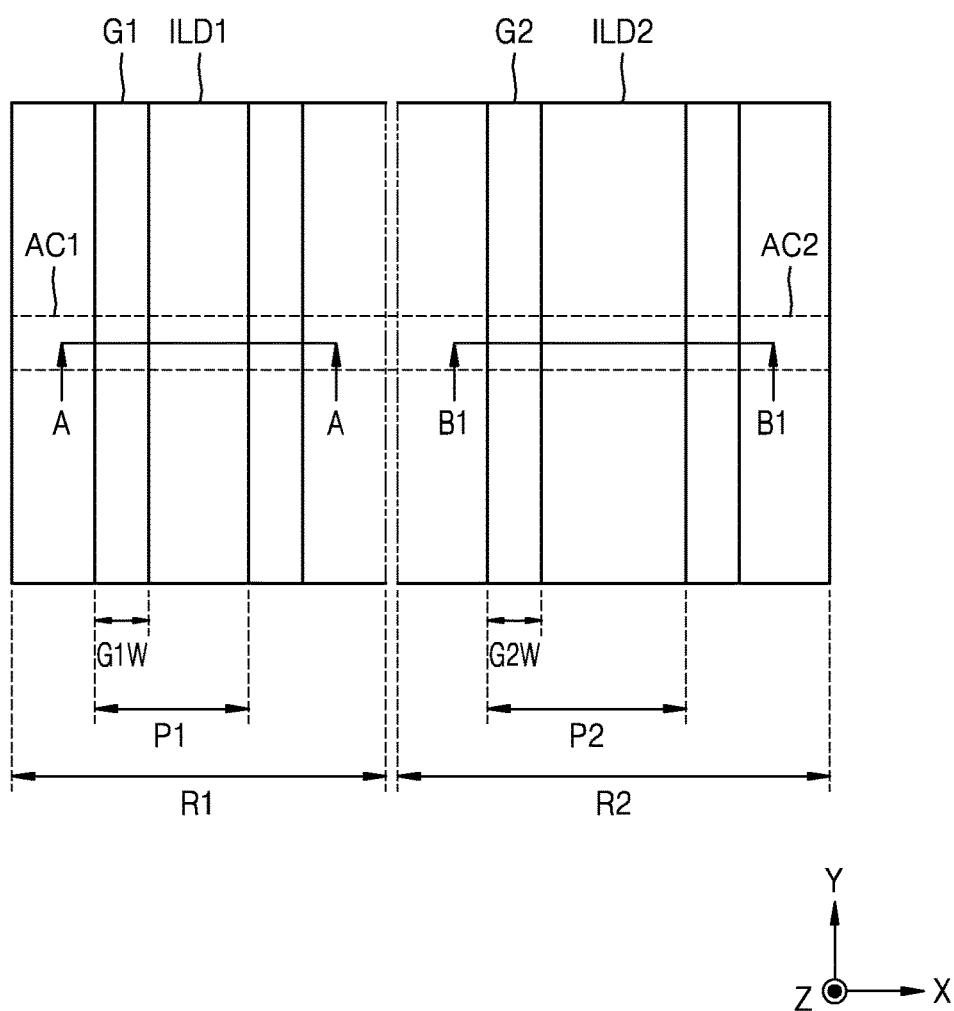
FIG. 2 is a schematic layout of a semiconductor device according to some example embodiments.

FIG. 2 is a schematic layout of a semiconductor device according to example embodiments.

Referring to FIG. 2, a first region R1 and a second region R2 of a substrate may respectively include a first active area AC1 and a second active area AC2 that extend in a first direction (X direction). In some example embodiments, the first region R1 may be a cell region, and the second region R2 may be an ambient region but the inventive concepts are not limited thereto.

A first pattern structure, for example, a first gate structure G1, may extend on the first region R1 in a second direction (Y direction) and intersect the first active area AC1. A second pattern structure, for example, a second gate structure G2, may extend on the second region R2 in the second direction (Y direction) and intersect the second active area AC2.

A plurality of first gate structures G1 may extend in parallel to each other. Each, or at least one, of the first gate structures G1 may have a first width G1W. The plurality of first gate structures G1 may have a first pitch P1. Accordingly, each, or at least one, of the first gate structures G1 may have a first pattern density on the first region R1. A plurality of second gate structures G2 may extend in parallel to each other. Each, or at least one, of the second gate structures G2 may have a second width G2W. The plurality of second gate structures G2 may have a second pitch P2. Accordingly, each, or at least one, of the second gate structures G2 may have a second pattern density on the second region R2, wherein the second pattern density is lower than the first pattern density.

A first interlayer insulating layer ILD1 may be formed on the first region R1 to cover side surfaces of the first gate structure G1. A second interlayer insulating layer ILD2 may be formed on the second region R2 to cover side surfaces of the second gate structure G2. The first and second interlayer insulating layers ILD1 and ILD2 may be contemporaneously or simultaneously formed by annealing preparatory first and second interlayer insulating layers including different materials. The preparatory second interlayer insulating layer may include a colloid including a dispersoid and a dispersion medium. The second interlayer insulating layer ILD2 may be formed to have enhanced tolerance, compared to the first interlayer insulating layer ILD1, by reacting the dispersoid and the dispersion medium through an annealing process. This will be described in detail with reference to FIGS. 3A through 3G below.

FIGS. 3A through 3G are cross-sectional views for sequentially describing a method of manufacturing a semiconductor device, according to example embodiments, wherein FIGS. 3A through 3G are cross-sectional views taken along lines A-A and B1-B1 of FIG. 2. FIG. 2 is a layout of a semiconductor device manufactured by using the example method of FIGS. 3A through 3G, and thus components of FIGS. 3A through 3G may not be the same as the components of FIG. 2. The components of FIGS. 3A through 3G may have a preceding relationship with the components of FIG. 2. For example, first and second dummy gate structures D107a and D107b may correspond to the first and second gate structures G1 and G2 of FIG. 2, and preparatory first and second interlayer insulating layers 111a and 117 may correspond to the first and second interlayer insulating layers ILD1 and ILD2 of FIG. 2.

Figure 3A:
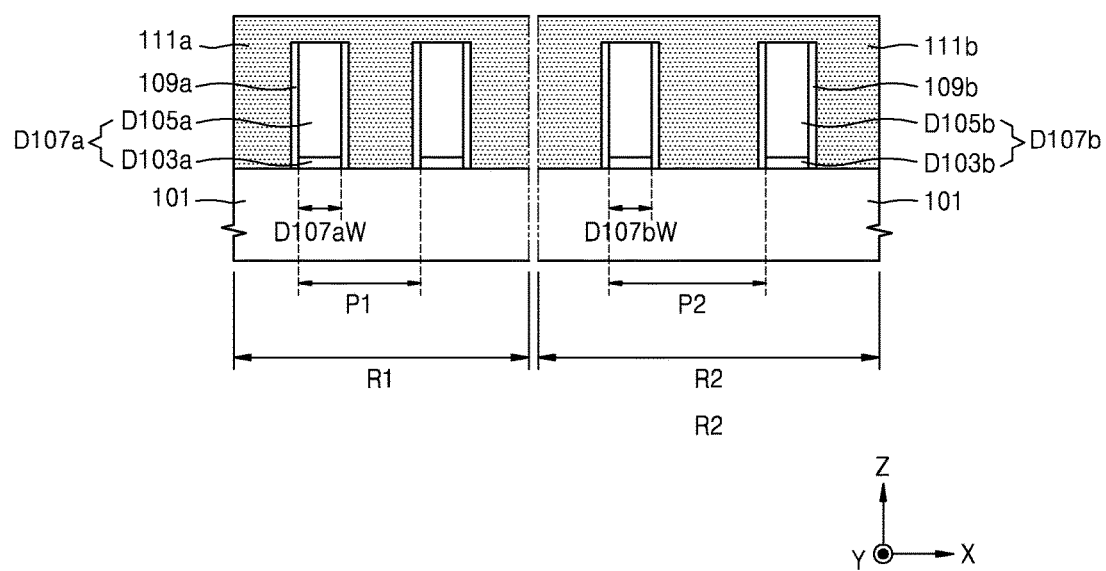

Referring to FIGS. 1, 2, and 3A, a plurality of first dummy gate structures D107a may be formed on the first region R1 of a substrate 101. A plurality of second dummy gate structures D107b may be formed on the second region R2 of the substrate 101 (S101). The first region R1 may be a cell region, and the second region R2 may be an ambient region but the inventive concepts are not limited thereto.

The substrate 101 may be formed based on a silicon bulk wafer or a silicon-on-insulator (SOI) wafer. However, a material of the substrate 101 is not limited to silicon. For example, the substrate 101 may include a Group IV semiconductor such as germanium (Ge), a Groups IV-IV compound semiconductor such as silicon germanium (SiGe) and silicon carbide (SiC), or a Groups III-V compound semiconductor such as gallium arsenide (GaAs), indium arsenide (InAs) and indium phosphide (InP). The substrate 101 may also be formed based on a SiGe wafer, an epitaxial wafer, a polished wafer, an annealed wafer, etc. The substrate 101 may be a p-type substrate or an n-type substrate. For example, the substrate 101 may be a p-type substrate including p-type impurity ions or an n-type substrate including n-type impurity ions.

An impurity region or a device separation layer for a source/drain region is omitted in FIGS. 3A through 3G but the inventive concepts do not exclude the structure. In some example embodiments, the impurity region or the device separation layer may be formed in the substrate 101. In other example embodiments, source/drain region may be further formed on the substrate 101 through an epitaxial process.

The first dummy gate structure D107a may include a first dummy gate insulating layer D103a and a first dummy gate electrode layer D105a. Likewise, the second dummy gate structure D107b may include a second dummy gate insulating layer D103b and a second dummy gate electrode layer D105b. The first and second dummy gate insulating layers D103a and D103b may include an amorphous carbon layer (ACL) or a carbon-spin-on-hardmask (C-SOH) that has high carbon content. The first and second dummy gate electrode layers D105a and D105b may include polysilicon. However, materials of the first and second dummy gate insulating layers D103a and D103b and the first and second dummy gate electrode layers D105a and D105b are not limited to the materials disclosed herein.

Each, or at least one, of the plurality of first dummy gate structures D107a may have a first width D107aW. The plurality of first dummy gate structures D107a may have the first pitch P1 and extend in a first direction (Y direction). Accordingly, the first dummy gate structure D107a may have a first pattern density on the first region R1. Each, or at least one, of the plurality of second dummy gate structures D107b may have a second width D107bW that is the same as the first width D107aW. However, the second pitch P2 of the plurality of second dummy gate structures D107b may be greater than the first pitch P1. Accordingly, the second dummy gate structure D107b may have a second pattern density on the second region R2, wherein the second pattern density is lower than the first pattern density.

First spacers 109a may be formed on both side walls, or at least one of the side walls, of the plurality of first dummy gate structures D107a. Second spacers 109b may be formed on both side walls, or at least one of the side walls, of the plurality of second dummy gate structures D107b. The first and second spacers 109a and 109b may include insulating layers, for example, silicon nitride layers, silicon oxynitride layers, or a combination thereof. The first and second spacers 109a and 109b may be formed by forming an insulating layer to uniformly cover the first and second dummy gate structures D107a and D107b and removing the insulating layer on upper surfaces of the first and second dummy gate structures D107a and D107b and an upper surface of the substrate 101 through dry etching and/or etching back.

Thereafter, a preparatory first interlayer insulating layer 111a may be formed on the first region R1 to cover the first dummy gate structure D107a (S103). In more detail, the preparatory first interlayer insulating layer 111a that is inserted between the first spacers 109a on the first region R1 and a sacrificial insulating layer 111b that is inserted between the second spacers 109b on the second region R2 may be contemporaneously or simultaneously formed. The preparatory first interlayer insulating layer 111a may cover side surfaces of the first spacers 109a and an upper surface of the first dummy gate structure D107a on the first region R1. The sacrificial insulating layer 111b may cover side surfaces of the second spacers 109b and an upper surface of the second dummy gate structure D107b on the second region R2.

The preparatory first interlayer insulating layer 111a and the sacrificial insulating layer 111b may include materials that are easy for gap-fill. For example, the preparatory first interlayer insulating layer 111a and the sacrificial insulating layer 111b may use a silicon oxide layer, Spin on Glass (SOG), Tonen SilaZen (TOSZ), Undoped Silica Glass (USG), Borosilica Glass (BSG), PhosphoSilaca Glass (PSG), BPSG (BoroPhosphoSilica Glass), Plasma Enhanced Tetra Ethyl Ortho Silicate (PRTEOS), Fluoride Silicate Glass (FSG), etc. The preparatory first interlayer insulating layer 111a and the sacrificial insulating layer 111b may be formed by Chemical Vapor Deposition (CVD), Flowable Chemical Vapor Deposition (FCVD), or Atomic Layer Deposition (ALD), but are not limited thereto.

Figure 3B:
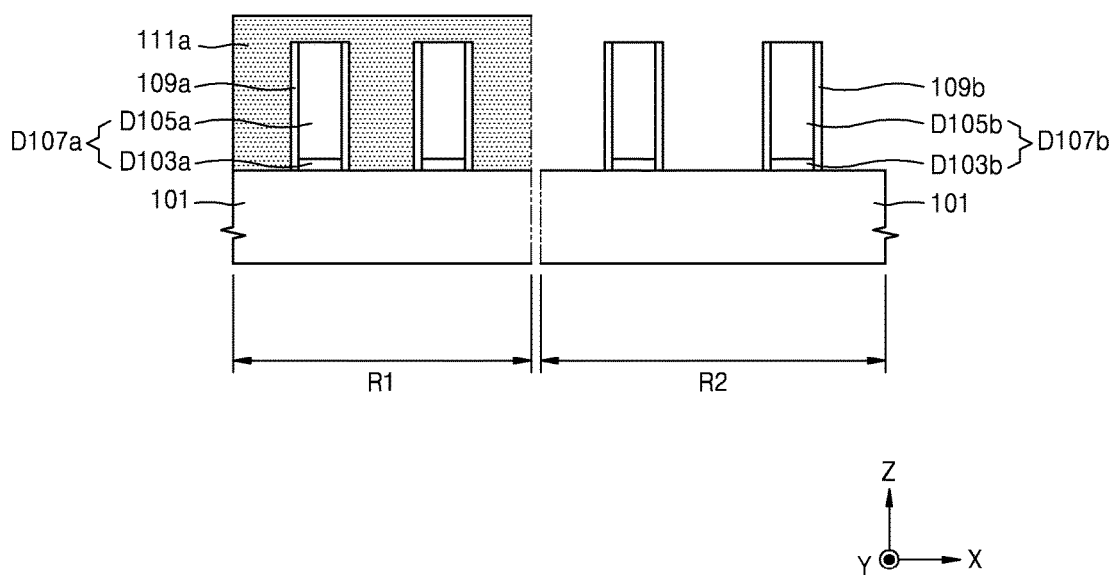

Referring to FIGS. 1, 2, and 3B, the sacrificial insulating layer 111b may be removed from the second region R2. The sacrificial insulating layer 111b may be removed by being selectively etched through a photolithography process.

Figure 3C:
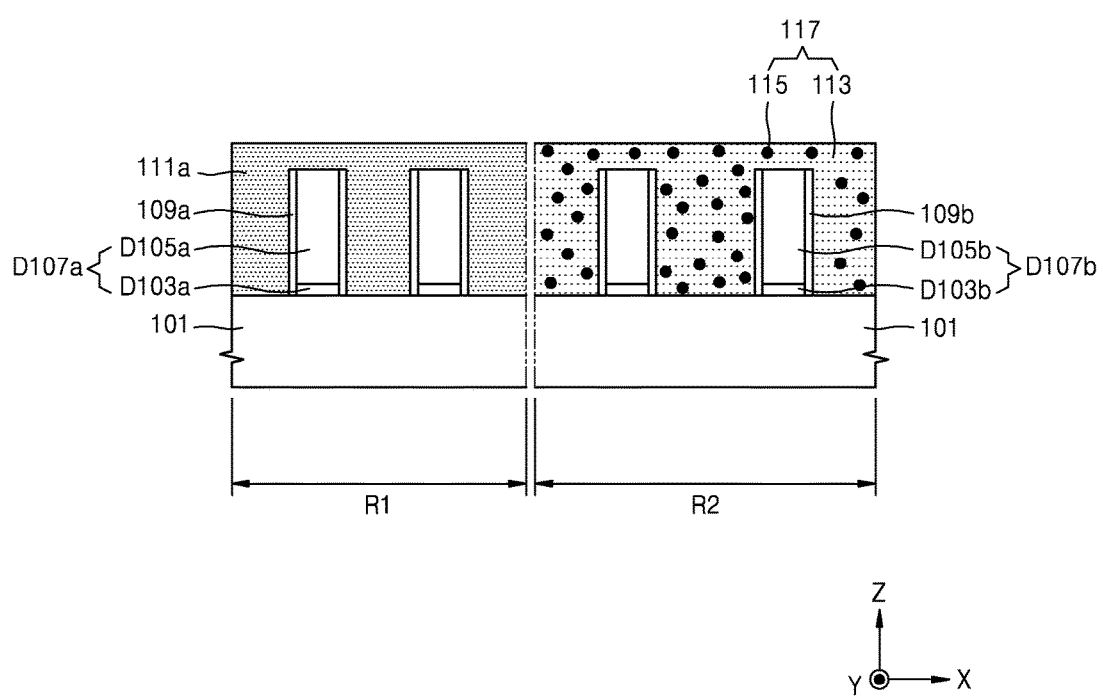

Referring to FIGS. 1, 2, and 3C, a preparatory second interlayer insulating layer 117 may be formed on the second region R2 and be inserted between the second spacers 109b (S105). The preparatory second interlayer insulating layer 117 may include a first colloid.

The first colloid may include a first dispersion medium 113 and a first dispersoid 115 dispersed in the first dispersion medium 113. The first colloid may be manufactured by adding the first dispersoid 115 to the first dispersion medium 113 and mixing the first dispersoid 115 with the first dispersion medium 113.

The first dispersion medium 113 may include a material that is typically considered to be easy for gap-fill. For example, the first dispersion medium 113 may be SOG, TOSZ, USG, BSG, PSG, BPSG, PRTEOS, FSG, etc. The first dispersion medium 113 may be formed by CVD, FCVD, or ALD, but is not limited thereto. In some example embodiments, the first dispersion medium 113 may include the same material as the preparatory first interlayer insulating layer 111a.

The first dispersoid 115 may be oxidized through, for example, an annealing process and may include materials that may be more bulky than silicon after the annealing process. For example, the first dispersoid 115 may be an IV-group element or an IV-group semiconductor such as silicon (Si), and germanium (Ge) but is not limited thereto. In some example embodiments, the first dispersoid 115 may be a Group III or Group IV element or a compound semiconductor thereof.

The concentration of the first colloid or the quantity of the first dispersoid 115 that is included in the first dispersion medium 113 may be selected according to a densification degree that may be advantageous for the second interlayer insulating layer formed by a subsequent annealing process. An increase in the concentration of the first colloid may result in an increase in the density of the second interlayer insulating layer, and thus a film material having strong tolerance to an etching or polishing process may be formed. This will be described in detail with reference to FIG. 5 below.

In other example embodiments, the preparatory first interlayer insulating layer 111a may include a second colloid. In this case, the concentration of the second colloid may be lower than the concentration of the first colloid of the preparatory first interlayer insulating layer 111a. Accordingly, the tolerance of the first interlayer insulating layer formed by annealing the preparatory first interlayer insulating layer 111a may be lower than the tolerance of the second interlayer insulating layer. This will be described in detail with reference to FIGS. 5 and 6 below.

Figure 3D:
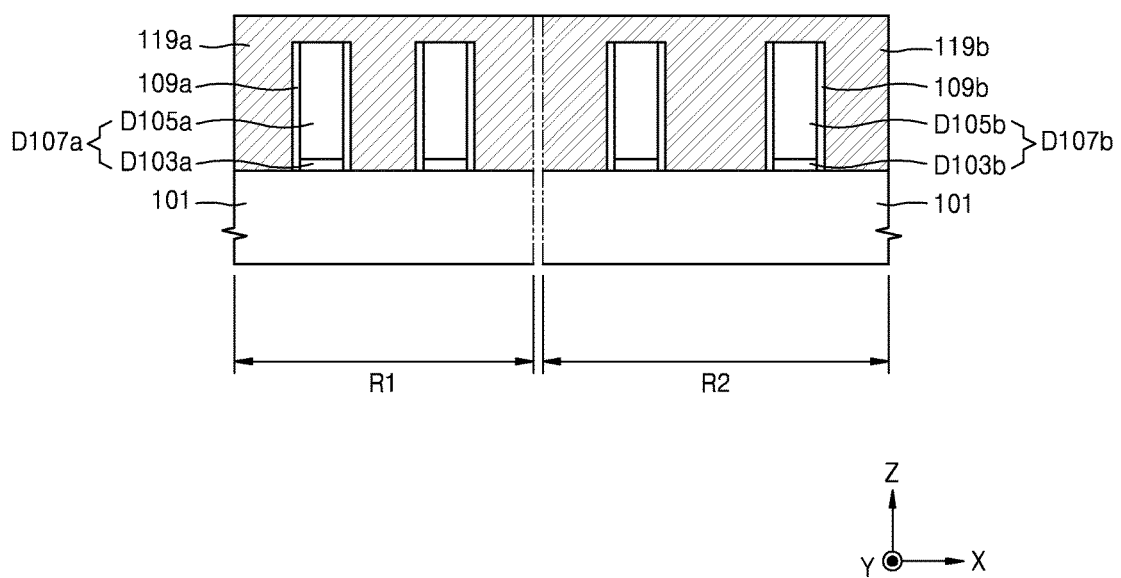

Referring to FIGS. 1, 2, and 3D, the preparatory first and second interlayer insulating layers 111a and 117 of FIG. 3C may be respectively converted into first and second interlayer insulating layers 119a and 119b by annealing a resultant of FIG. 3C (S107).

In more detail, the preparatory first and second interlayer insulating layers 111a and 117 of FIG. 3C may be respectively converted into the first and second interlayer insulating layers 119a and 119b through an oxidation reaction in the annealing process. For example, the preparatory first interlayer insulating layer 111a may be SOG, and the first interlayer insulating layer 119a may be a silicon oxide layer. A dispersion medium of the preparatory second interlayer insulating layer 117 may be SOG. A dispersoid of the preparatory second interlayer insulating layer 117 may be silicon or a silicon compound. The second interlayer insulating layer 119b may be a high density silicon oxide layer.

Densities of the preparatory first and second interlayer insulating layers 111a and 117 of FIG. 3C may increase through the annealing process. In this regard, since the preparatory second interlayer insulating layer 117 of FIG. 3C includes the first colloid, the oxidation reaction may more actively occur in the preparatory second interlayer insulating layer 117 due to the first dispersion medium 113. Accordingly, a density of the preparatory second interlayer insulating layer 117 of FIG. 3C may greatly increase, compared to a density of the preparatory first interlayer insulating layer 111a, and thus the preparatory second interlayer insulating layer 117 of FIG. 3C may be densified, and the tolerance of the second interlayer insulating layer 119b formed based on the first colloid may be relatively enhanced, compared to the first interlayer insulating layer 119a. That is, the second interlayer insulating layer 119b may include a strong film material having a small etching rate, compared to the first interlayer insulating layer 119a.

The annealing process may be performed in a gas atmosphere including at least one of oxygen ($O_2$), water ($H_2O$), or a combination thereof at a range from about 400° C. to about 700° C.

Figure 3E:
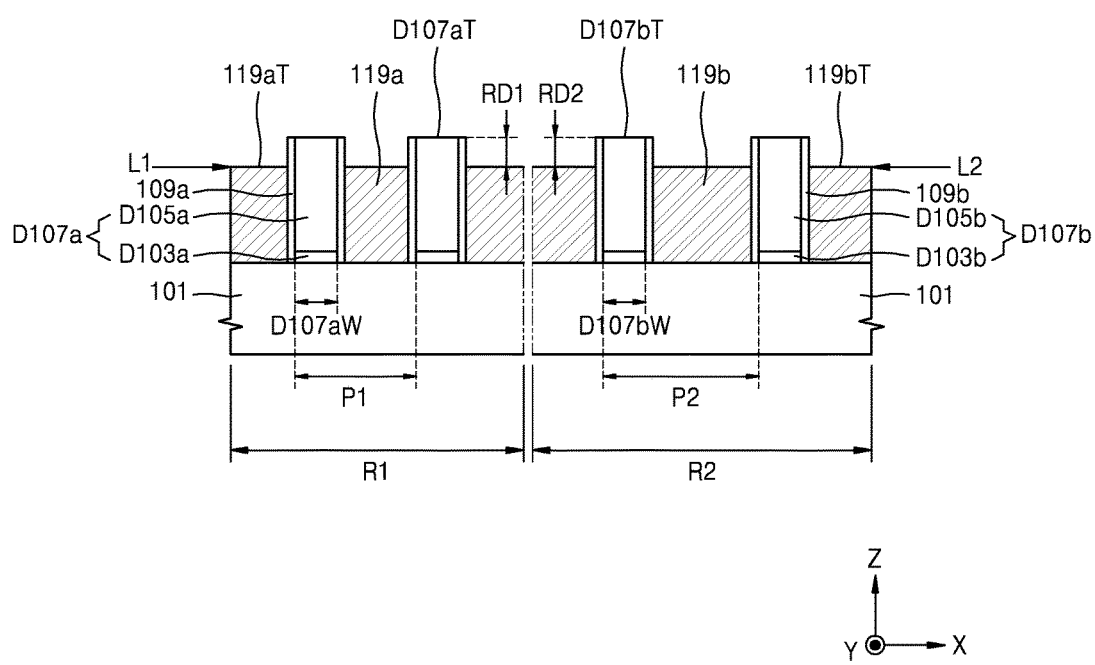

Referring to FIGS. 1, 2, and 3E, a planarization process may be performed on an entire surface including the first and second regions R1 and R2. The planarization process may be performed by using, for example, a chemical mechanical polishing (CMP) method or an etch-back method. Upper sides of the first and second interlayer insulating layers 119a and 119b may be partially removed through the planarization process, and thus an upper surface D107aT of the first dummy gate structure D107a and an upper surface D107bT of the second dummy gate structure D107b may be exposed. In this regard, the planarization process may be further performed in order to recess the first and second interlayer insulating layers 119a and 119b so that upper surfaces 119aT and 119bT of the first and second interlayer insulating layers 119a and 119b are lower than the upper surfaces D107aT and D107bT of the first and second dummy gate structures D107a and D107b.

According to the example planarization process, the first interlayer insulating layer 119a having a first pattern density may be recessed by a first depth RD1 from the upper surfaces D107aT and D107bT of the first and second dummy gate structures D107a and D107b. Contemporaneously or simultaneously, although the second interlayer insulating layer 119b has a second pattern density that is lower than the first pattern density, the second interlayer insulating layer 119b may be recessed by a second depth RD2 that is the same as the first depth RD1. That is, as a result of the planarization process, a level L1 of the upper surface 119aT of the first interlayer insulating layer 119a may be the same as a level L2 of the upper surface 119bT of the second interlayer insulating layer 119b.

In general, during a planarization process, there may be a difference in a recess depth of an interlayer insulating layer filling between patterns according to a pattern density difference. Although the planarization process is typically performed on an entire surface under the same condition, a region having a high pattern density may have a small recess depth, whereas a region having a low pattern density is extremely etched and thus has a great recess depth.

However, according to the inventive concepts, the second interlayer insulating layer 119b having enhanced tolerance to an etching or polishing process may be formed on the second region R2 having the second pattern density that is lower than the first pattern density. Accordingly, in spite of the planarization process, the second interlayer insulating layer 119b may maintain substantially the same etching rate as the first interlayer insulating layer 119a, thereby hindering or preventing the second interlayer insulating layer 119b from being extremely etched.

In the planarization process of FIG. 3E, the first and second interlayer insulating layers 119a and 119b may be recessed so that the upper surfaces 119aT and 119bT of the first and second interlayer insulating layers 119a and 119b are lower than the upper surfaces D107aT and D107bT of the first and second dummy gate structures D107a and D107b, but the inventive concepts are not limited thereto. In some example embodiments, when the upper surfaces 119aT and 119bT of the first and second interlayer insulating layers 119a and 119b have the same levels as the levels of the upper surfaces D107aT and D107bT of the first and second dummy gate structures D107a and D107b, the first and second dummy gate structures D107a and D107b may be removed and a gate insulating layer and a gate electrode layer may be formed, thereby manufacturing a semiconductor device.

Figure 3F:
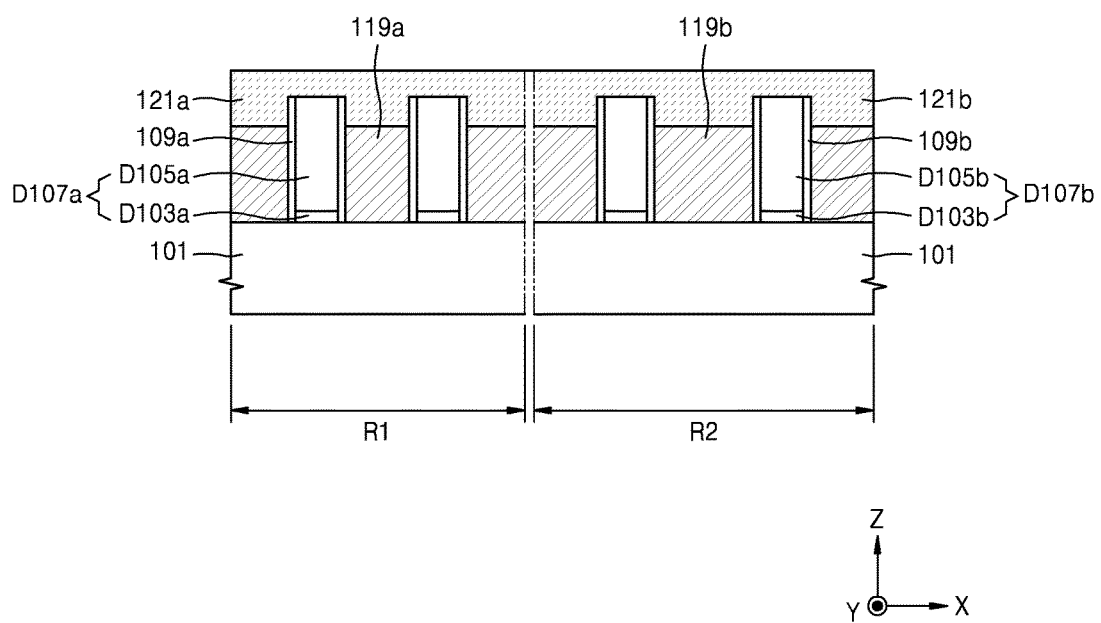

Referring to FIGS. 1, 2, and 3F, third interlayer insulating layers 121a and 121b may be formed to cover the upper surfaces 119aT and 119bT of the first and second interlayer insulating layers 119a and 119b and the exposed side and upper surfaces of the first and second dummy gate structures D107a and D107b.

The third interlayer insulating layers 121a and 121b may include a film material having an etching speed or a polishing speed that is lower than the first and second interlayer insulating layers 119a and 119b. For example, when the first and second interlayer insulating layers 119a and 119b are silicon oxide layers, the third interlayer insulating layers 121a and 121b may be a silicon oxide layer, a silicon oxynitride layer, or a combination thereof. The third interlayer insulating layers 121a and 121b may include the same material as the first and second spacers 109a and 109b.

Although the first and second interlayer insulating layers 119a and 119b may include a material that is easy for gap-fill, since the first and second interlayer insulating layers 119a and 119b have weak tolerance to an etching or polishing process, loss of the first and second interlayer insulating layers 119a and 119b may occur during a subsequent process. In this regard, the third interlayer insulating layers 121a and 121b including a strong tolerance material may be formed on the first and second interlayer insulating layers 119a and 119b, thereby reducing or preventing loss of the first and second interlayer insulating layers 119a and 119b between the first and second dummy gate structures D107a and D107b.

Figure 3G:
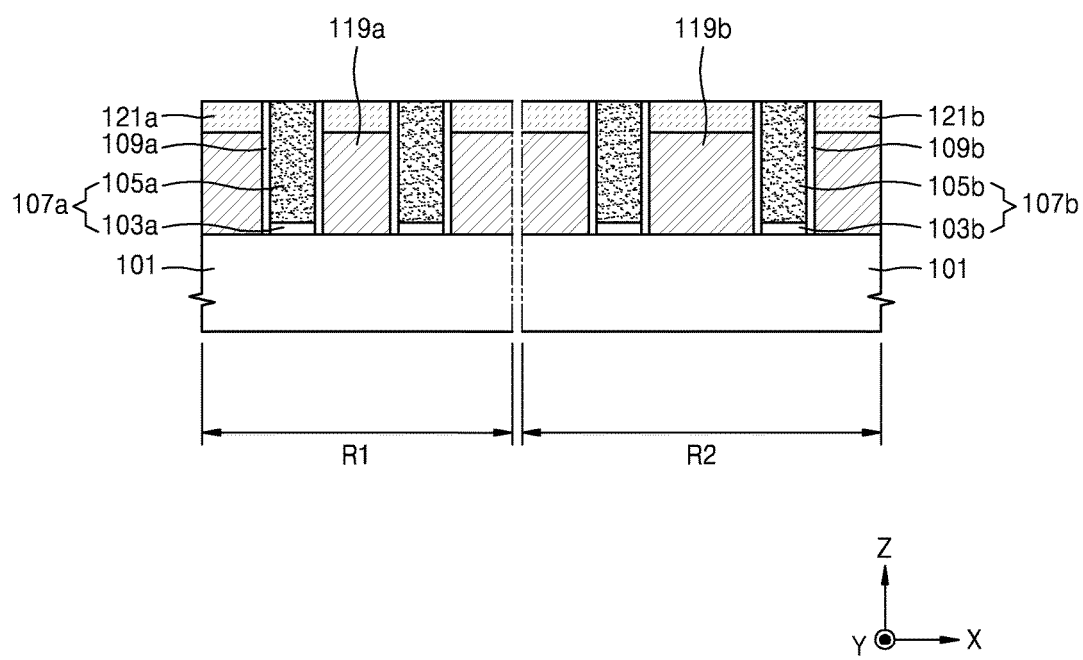

Referring to FIGS. 1, 2, and 3G, a planarization process may be performed on the third interlayer insulating layers 121a and 121b formed on the first and second regions R1 and R2, respectively. The planarization process may be performed by using a CMP method or an etch-back method. According to the example planarization process, upper surfaces of the first and second dummy gate structures D107a and D107b and the first and second spacers 109a and 109b may be exposed. In this regard, heights of the first and second dummy gate structures D107a and D107b and the first and second spacers 109a and 109b may be lowered.

The exposed first and second dummy gate structures D107a and D107b and first and second spacers 109a and 109b may be removed by using a wet etching method or a dry etching method to form openings that expose an upper surface of the substrate 101.

Thereafter, first and second gate insulating layers 103a and 103b may be formed in openings of the first and second regions R1 and R2, respectively. First and second gate electrode layers 105a and 105b may be formed on the first and second gate insulating layers 103a and 103b, respectively. The first and second gate insulating layers 103a and 103b may include at least one material selected from a silicon oxide layer, a silicon nitride layer, a silicon oxynitride layer, oxide/nitride/oxide (ONO), and a high-k dielectric film having a dielectric constant higher than the silicon oxide layer. For example, the first and second gate insulating layers 103a and 103b may have a dielectric constant from about 10 to about 25 but are not limited thereto. The first and second gate insulating layers 103a and 103b may be formed by using various deposition methods such as CVD, low pressure CVD (LPCVD), atmospheric pressure CVD APCVD, low temperature CVD (LTCVD), plasma enhanced CVD (PECVD), atomic layer CVD (ALCVD), ALD, physical vapor deposition (PVD), etc.

The first and second gate electrode layers 105a and 105b may have a structure including at least one layer. The at least one layer may include Ti, TiN, Ta, TaN, W, Cu, Al, AtAlC, TaAlC, or a combination thereof but is not limited thereto. Although not shown, the first and second gate electrode layers 105a and 105b may have a structure including multiple layers. The first and second gate electrode layers 105a and 105b may be formed by PVD or CVD but are not limited thereto.

After forming the first and second gate electrode layers 105a and 105b, a planarization process may be performed to expose upper surfaces of the third interlayer insulating layers 121a and 121b. Accordingly, first and second gate insulating layers 107a and 107b may be formed in the openings of the first and second regions R1 and R2, respectively.

In some example embodiments, the first and second gate insulating layers 107a and 107b may constitute a planar-type transistor formed to intersect the planar substrate 101. In other example embodiments, the first and second regions R1 and R2 may include fins protruding from the upper surface of the substrate 101 and extending in one direction, and the first and second gate insulating layers 107a and 107b may constitute a fin-type transistor formed to intersect the fins in the first and second regions R1 and R2.

The first and second interlayer insulating layers 119a and 119b cover the first and second gate insulating layers 107a and 107b on the substrate 101 in FIGS. 2 through 3G but are not limited thereto. The first and second interlayer insulating layers 119a and 119b may cover various pattern structures formed on the substrate 101.

Figure 4:
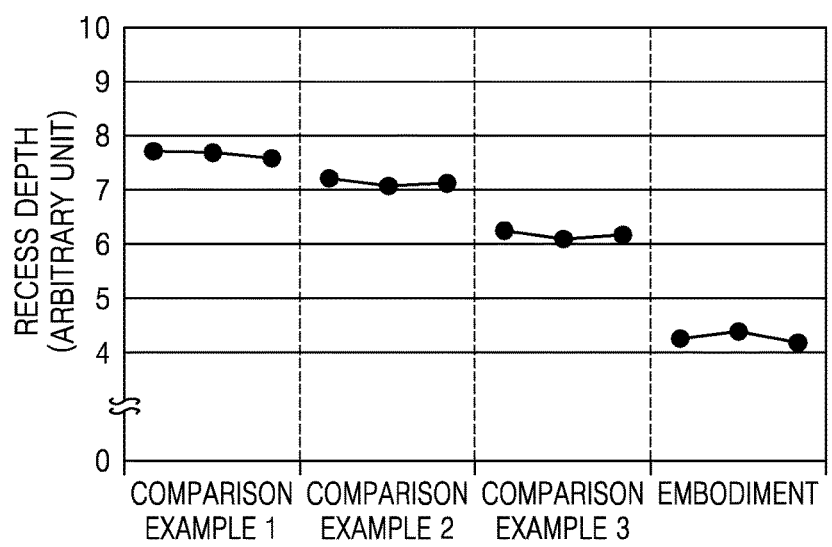
FIG. 4 is a graph showing a comparison of a recess depth of a general interlayer insulating layer and an interlayer insulating layer based on a colloid.

FIG. 4 is a graph showing a comparison of a recess depth of a general interlayer insulating layer and an interlayer insulating layer based on a colloid. Comparison examples 1 through 3 and an example embodiment are results obtained by performing etching and polishing processes under the same conditions.

Referring to FIG. 4, the comparison example 1 may have about 7.7 on average as a recess depth with respect to an interlayer insulating layer including a general insulating material. Since the comparison example 1 may have an excellent gap-fill characteristic, the comparison example 1 may be used to fill between fine patterns but, the comparison example 1 may have weak tolerance to etching and polishing processes.

The comparison example 2 may have about 7.1 on average as a recess depth with respect to an interlayer insulating layer formed by annealing a general insulating material. Since the comparison example 2 may have an excellent gap-fill characteristic, the comparison example 2 may be used to fill between fine patterns, whereas the comparison example 3 may have weak tolerance to etching and polishing processes.

The comparison example 3 may have about 6.1 on average as a recess depth with respect to an interlayer insulating layer formed by using high density plasma (HDP). Since the comparison example 3 may have relatively strong tolerance to etching and polishing processes compared to the comparison examples 1 and 2, the comparison example 3 may be structurally stable. However, since the comparison example 3 has a low gap-fill characteristic, it may be difficult to fill patterns having a high aspect ratio.

The example embodiment may have a recess depth with respect to the interlayer insulating layer based on a colloid. The recess depth of the example embodiment may be about 4.3 on average. Since an interlayer insulating material is in a colloid state during a gap-fill process in the example embodiment, the example embodiment may have an excellent gap-fill characteristic. After the gap-fill process, since the colloid may be anneal and converted, the interlayer insulating layer may have strong tolerance to etching and polishing processes. That is, since the example embodiment has a stronger tolerance than the comparison examples 1 through 3, the example embodiment may have a low etching rate.

Referring to FIGS. 3E and 4, the first interlayer insulating layer 119a of the first region R1 may correspond to the interlayer insulating layer of the comparison example 2. The second interlayer insulating layer 119b of the second region R2 may correspond to the interlayer insulating layer of the example embodiment. Since an etching rate of the second interlayer insulating layer 119b is lower than the etching rate of the first interlayer insulating layer 119a, the second interlayer insulating layer 119b may not be extremely etched in the second region R2 having a second pattern density lower than a first pattern density. Accordingly, the upper surfaces 119aT and 119bT of the first and second interlayer insulating layers 119a and 119b may have the same level through a planarization process.

Figure 5:
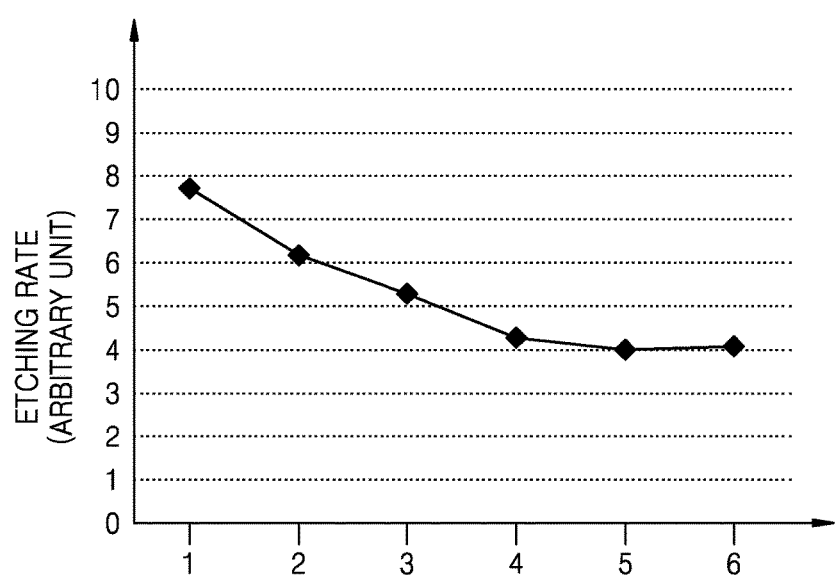
FIG. 5 is a graph showing an etching rate of an interlayer insulating layer with respect to concentration of a colloid.

FIG. 5 is a graph showing an etching rate of an interlayer insulating layer with respect to concentration of a colloid.

Referring to FIG. 5, when the concentration of the colloid included in a preparatory interlayer insulating layer increases from 1 to 4, the etching rate may decrease from about 9 to about 4. Although the concentration of the colloid increases more than a certain colloid, the etching rate may be maintained at about 4. That is, as the concentration of the colloid included in the preparatory interlayer insulating layer increases, the etching rate of the interlayer insulating layer formed by annealing the preparatory interlayer insulating layer may decrease within a specific limit range.

Referring to FIGS. 3C, 3D and 5, densities of the preparatory first and second interlayer insulating layers 111a and 117 may increase through an oxidation reaction in an annealing process. In this regard, an oxidation reaction may more actively occur in the preparatory second interlayer insulating layer 117 including a first colloid. As concentration of the first colloid increases, since the oxidation reaction frequently occurs, a density of the second interlayer insulating layer 119b may greatly increase, and thus densification may be intensified and a film material may have a strong tolerance to etching and polishing.

Concentration of the first colloid of the second interlayer insulating layer 119b may be selectively determined in consideration of a pattern density difference and an etching speed difference of the first and second regions R1 and R2.

Figure 6:
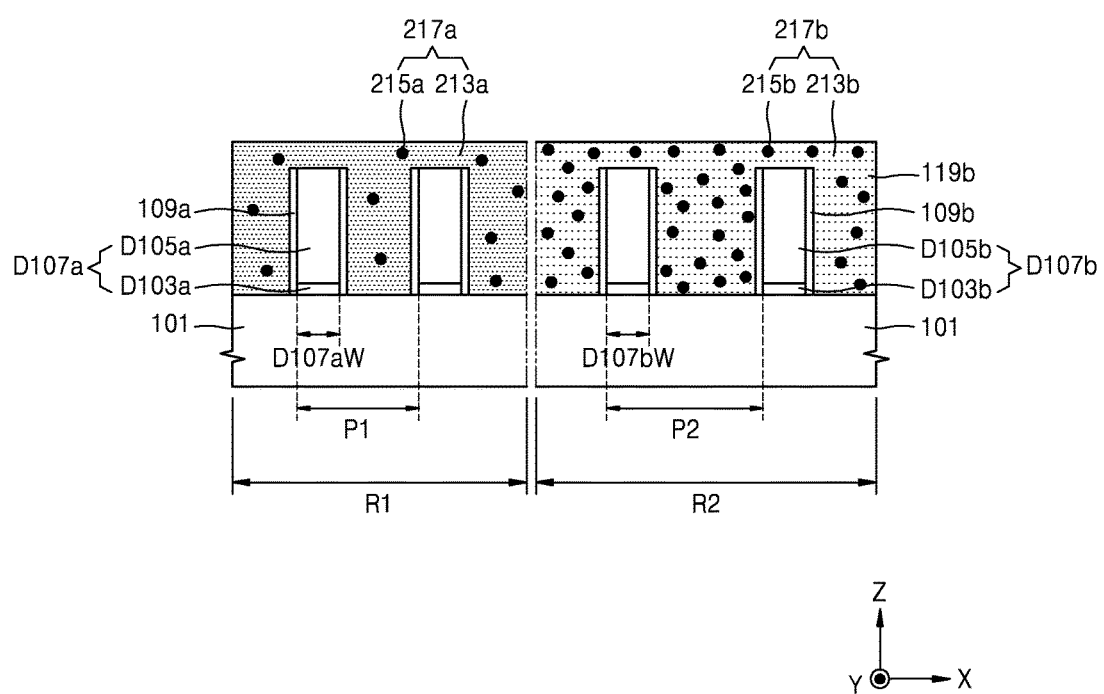
FIG. 6 is a cross-sectional view for describing a method of manufacturing a semiconductor device, according to another example embodiment.

FIG. 6 is a cross-sectional view for describing a method of manufacturing a semiconductor device, according to another example embodiment. The method of FIG. 6 may be similar to or the same as the method described with reference to FIGS. 3A through 3G except that a preparatory first interlayer insulating layer 217a includes a second colloid. FIG. 6 is a cross-sectional view taken along lines A-A and B1-B1 of FIG. 2. The first and second dummy gate structures D107a and D107b may correspond to the first and second gate structures G1 and G2 of FIG. 2. Preparatory first and second interlayer insulating layers 217a and 217b may correspond to the first and second interlayer insulating layers ILD1 and ILD2 of FIG. 2. Redundant descriptions thereof are omitted.

Referring to FIGS. 3A and 6, the first dummy gate structures D107a may be formed at a first pattern density on the first region R1 of the substrate 101, and the second dummy gate structures D107b may be formed at a second pattern density on the second region R2 of the substrate 101, wherein the second pattern density is lower than the first pattern density.

The preparatory first interlayer insulating layer 217a that is inserted between the first spacers 109a on the first region R1 and a sacrificial insulating layer that is inserted between the second spacers 109b on the second region R2 may be contemporaneously or simultaneously formed. In this regard, the preparatory first interlayer insulating layer 217a may include the second colloid.

The second colloid may include a second dispersion medium 213a and a second dispersoid 215a dispersed in the second dispersion medium 213a. The second colloid may be manufactured by adding the second dispersoid 215a to the second dispersion medium 213a and mixing the second dispersoid 215a with the second dispersion medium 213a.

Referring to FIGS. 3B, 3C, and 6, the sacrificial insulating layer formed on the second region R2 may be removed, and a preparatory second interlayer insulating layer 217b that is inserted between the second spacers 109b on the second region R2 may be formed. In this regard, the preparatory second interlayer insulating layer 217b may include a first colloid. The first colloid may include a first dispersion medium 213b and a first dispersoid 215b dispersed in the first dispersion medium 213b.

Thereafter, the semiconductor device may be manufactured by performing subsequent processes according to FIGS. 3D through 3G. Concentration of the second colloid or an amount of the second dispersoid 215a may be selected according to a densification degree that may be advantageous for a first interlayer insulating layer formed by a subsequent annealing process. In this case, the concentration of the second colloid may be lower than the concentration of the first colloid of the preparatory second interlayer insulating layer 217b. Accordingly, the tolerance of the first interlayer insulating layer formed by annealing the preparatory first interlayer insulating layer 217a may be lower than the tolerance of a second interlayer insulating layer formed by annealing the preparatory second interlayer insulating layer 217b.

Figure 7:
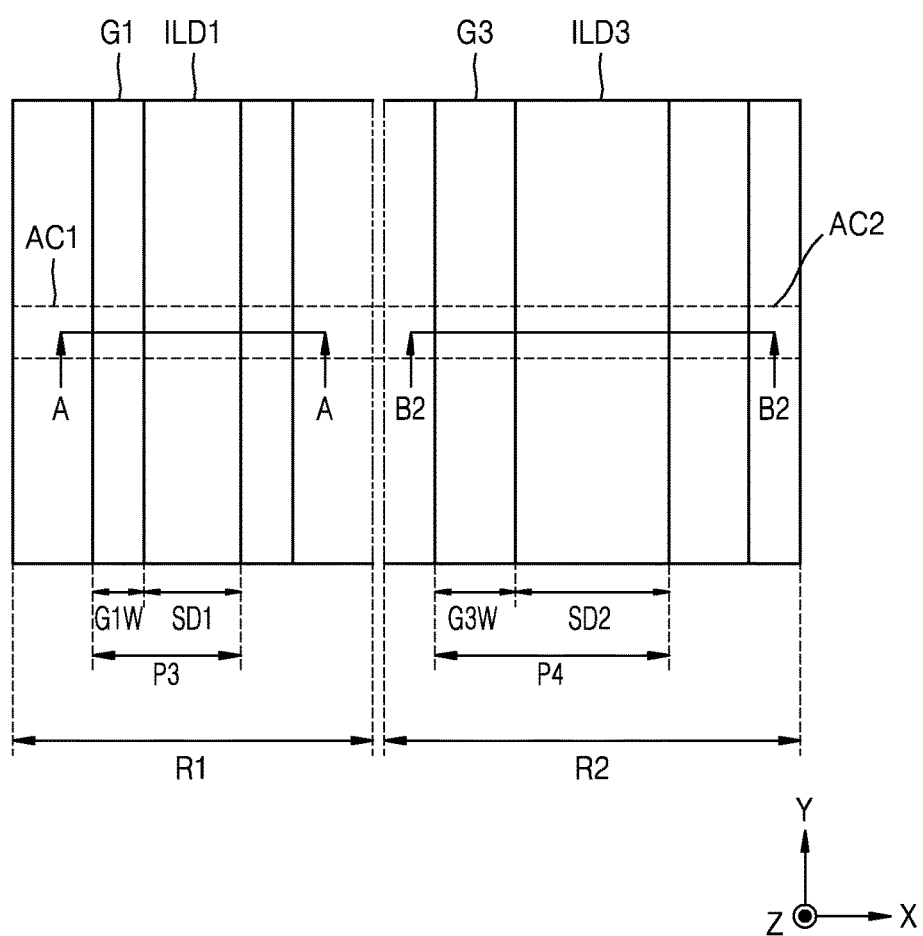
FIG. 7 is a schematic layout of a semiconductor device according to other example embodiments.

FIG. 7 is a schematic layout of a semiconductor device according to other example embodiments. FIG. 7 is a layout of a semiconductor device manufactured by using a method of FIGS. 8A through 8C, and thus components of FIGS. 8A through 8C may not be the same as the components of FIG. 7. The components of FIGS. 8A through 8C may have a preceding relationship with the components of FIG. 7. The semiconductor device of FIG. 7 is similar to or the same as the semiconductor of FIG. 2, except for a shape and an arrangement of a second gate structure G3 of the second region R2.

Referring to FIG. 8, the plurality of first gate structures G1 may extend in parallel to each other. Each, or at least one, of the first gate structures G1 may have the first width G1W. The plurality of adjacent first gate structures G1 may be spaced apart from each other by a first space distance SD1 and may have the first pitch P3. Accordingly, each, or at least one, of the first gate structures G1 may have a first pattern density on the first region R1.

A plurality of second gate structures G3 may extend in parallel to each other. Each, or at least one, of the second gate structures G3 may have a second width G3W that is greater than the first width G1W. The plurality of adjacent second gate structures G3 may be spaced apart from each other by a second space distance SD2 that is greater than the first space distance SD1 and may have a second pitch P4. In this regard, although the first and second gate structures G1 and G3 have different widths and spaces, the first pattern density of each, or at least one, of the first gate structures G1 may be the same as a second pattern density of each, or at least one, of the second gate structures G3.

The first interlayer insulating layer ILD1 may be formed on the first region R1 to cover side surfaces of the first gate structure G1. A second interlayer insulating layer ILD3 may be formed on the second region R2 to cover side surfaces of the second gate structure G3. The second interlayer insulating layer ILD3 may be formed by annealing a colloid.

The first region R1 may be a cell region, and the second region R2 may be an ambient region but the inventive concepts are not limited thereto.

Figure 8A:
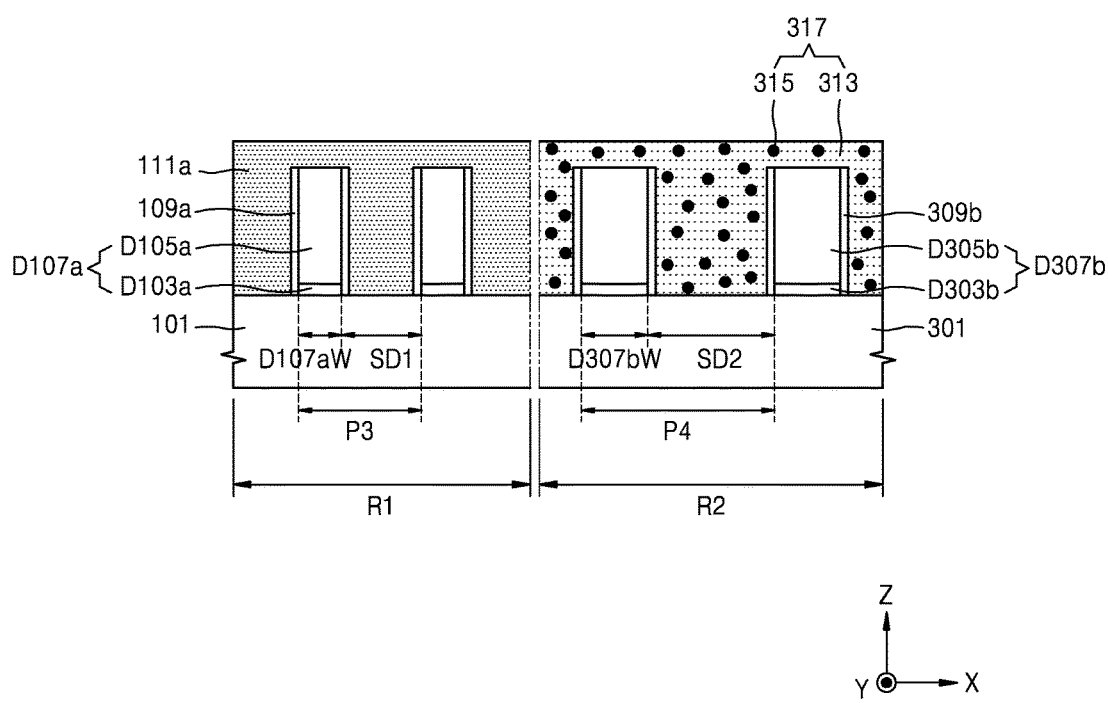
Figure 8B:
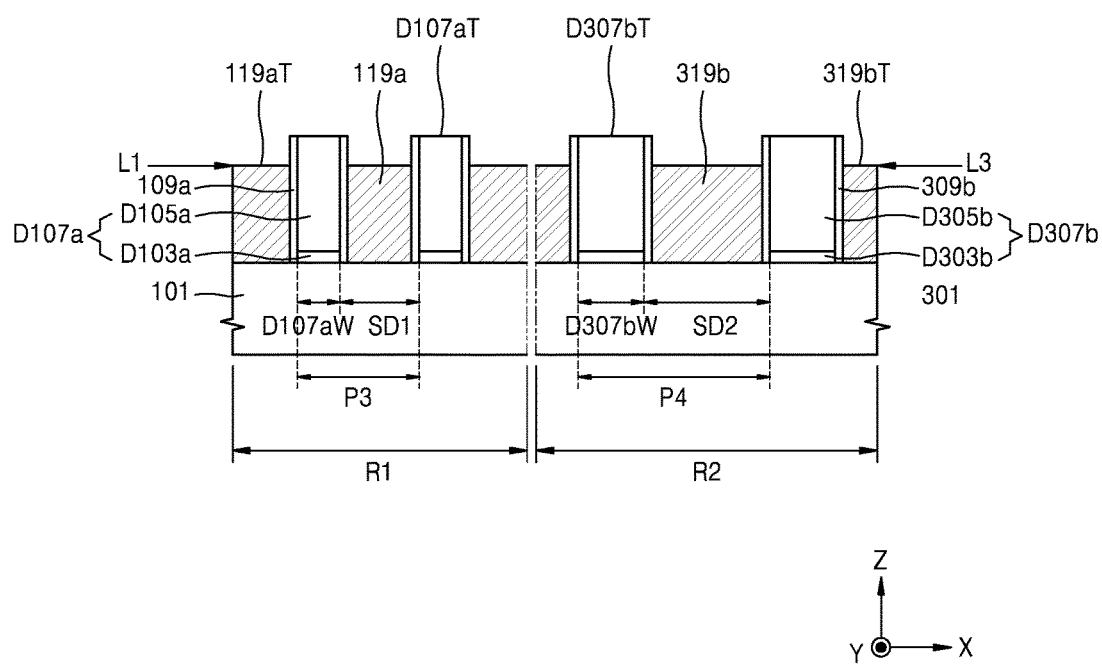
Figure 8C:
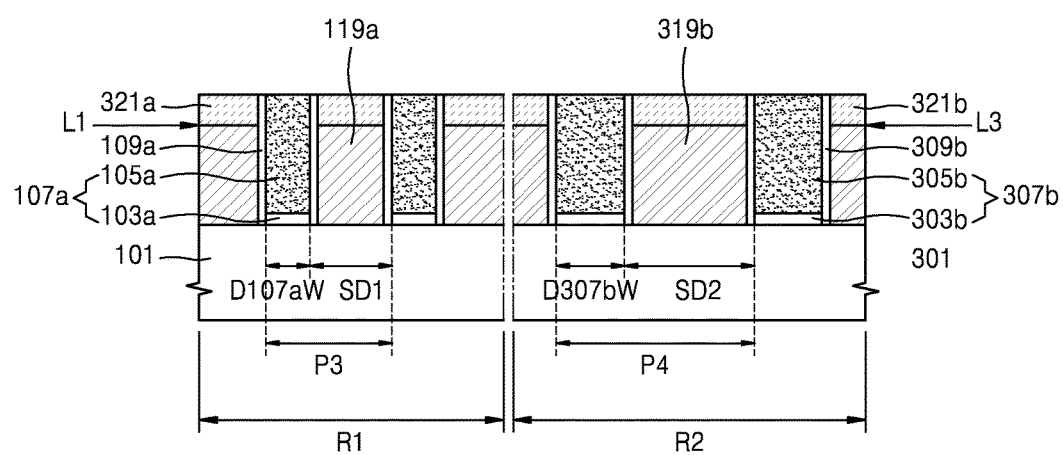
Figure 8C:
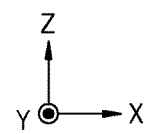

FIGS. 8A through 8C are cross-sectional views for sequentially describing a method of manufacturing a semiconductor device, according to other example embodiments, wherein FIGS. 8A through 8C are cross-sectional views taken along lines A-A and B2-B2 of FIG. 7.

Referring to FIGS. 7 and 8A, a second dummy gate structure D307b including a second dummy gate insulating layer D303b and a second dummy gate electrode layer D305b and a second spacer 309b surrounding side surfaces of the second dummy gate structure D307b may be formed on the second region R2.

A width D307bW of the second dummy gate structure D307b and the second space distance SD2 between patterns may be greater than a width D107aW of the first dummy gate structure D308a and the first space distance SD1 between patterns. Accordingly, the first and second dummy gate structures D307a and D307b may have the same pattern density. However, even though the pattern density may be the same, when a space between adjacent patterns is great, a challenge of extreme etching may occur during a planarization process.

In the method of manufacturing the semiconductor device according to the example embodiment, a preparatory second interlayer insulating layer 317 including colloid may be formed on the second region R2 having a space distance between the second dummy gate structures D307b greater than the first dummy gate structures D307a. The preparatory second interlayer insulating layer 317 may include a dispersion medium 313 and a dispersoid 315. The dispersion medium 313 and the dispersoid 315 are the same as described with reference to FIG. 3C.

Concentration of the colloid included in the preparatory second interlayer insulating layer 317 or an amount of the dispersoid 315 may be selected according to a densification degree that may be advantageous for a second interlayer insulating layer formed by a subsequent annealing process.

Referring to FIGS. 7 and 8B, the preparatory first and second interlayer insulating layers 111a and 317 of FIG. 8A may be respectively converted into the first and second interlayer insulating layers 119a and 319b by annealing a resultant of FIG. 8A. The second interlayer insulating layer 319b formed based on a colloid may have relatively enhanced tolerance, compared to the first interlayer insulating layer 119a. That is, the second interlayer insulating layer 319b may include a film material having an etching rate lower than the etching rate of the first interlayer insulating layer 119a.

Thereafter, a planarization process may be performed on an entire surface including the first and second regions R1 and R2. Although the space distance SD2 between patterns on the second region R2 is greater than the space distance SD2 between patterns on the first region R1, since the second interlayer insulating layer 319b has enhanced tolerance to an etching or polishing process, the first and second interlayer insulating layers 119a and 319b may have the same etching rate. That is, as a result of the planarization process, the level L1 of the upper surface 119aT of the first interlayer insulating layer 119a may be the same as the level L2 of an upper surface 319bT of the second interlayer insulating layer 319b.

Referring to FIGS. 7 and 8C, the third interlayer insulating layers 321a and 321b may be formed to cover the upper surfaces 19aT and 319bT of the first and second interlayer insulating layers 119a and 319b and the exposed side and upper surfaces of the first and second dummy gate structures D107a and D307b, and a planarization process may be performed. Thereafter, openings may be formed by removing the first and second dummy gate structures D107a and D307b. The first and second gate insulating layers 107a and 307b may be formed by forming the first and second mask patterns 103a and 303b in the openings and forming the first and second gate electrode layers 105a and 301b respectively in the first and second mask patterns 103a and 303b. As described above, the method of manufacturing the semiconductor device according to the example embodiment may resolve a challenge of extreme etching of an interlayer insulating layer due to a great space distance between patterns.

Figure 9:
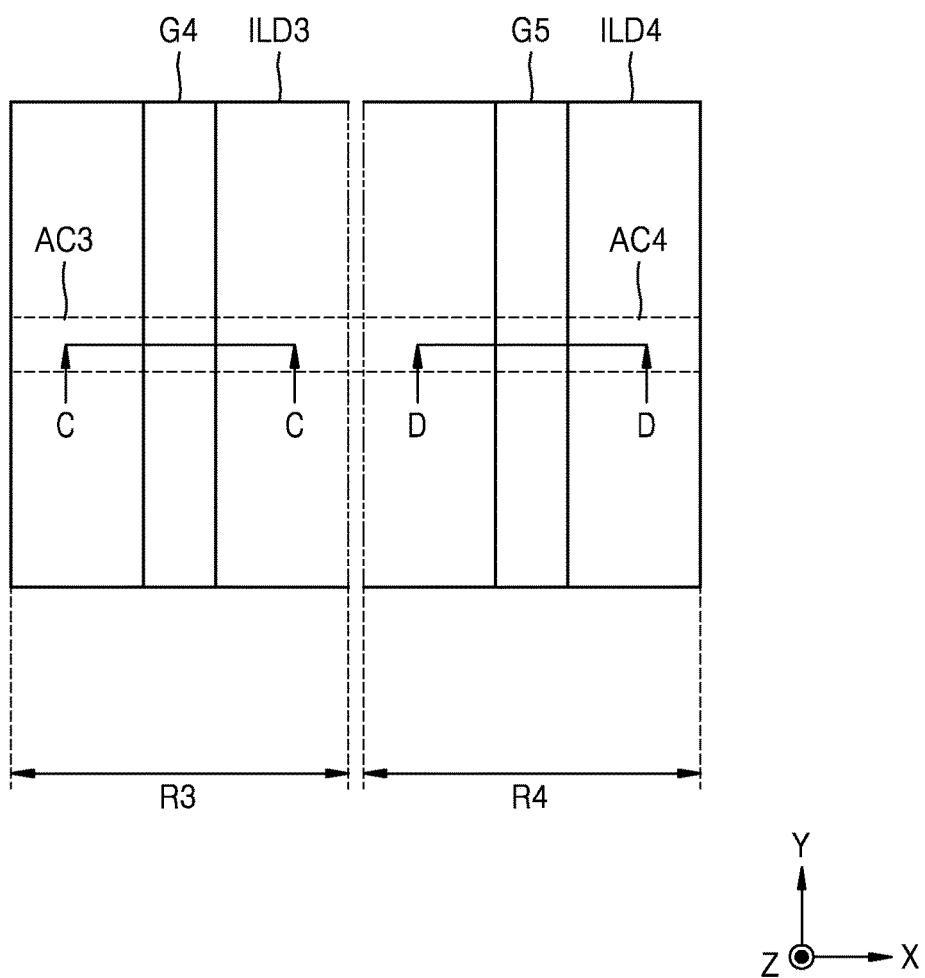
FIG. 9 is a schematic layout of a semiconductor device according to other example embodiments.

FIG. 9 is a schematic layout of a semiconductor device according to other example embodiments.

FIGS. 10A through 10F are cross-sectional views for sequentially describing a method of manufacturing a semiconductor device, according to other example embodiments, wherein FIGS. 10A through 10F are cross-sectional views taken along lines C-C and D-D of FIG. 9. FIG. 9 is a layout of a semiconductor device manufactured by using the method of FIGS. 10A through 10F, and thus components of FIGS. 10A through 10F may not be the same as components of FIG. 9. The components of FIGS. 10A through 10F may have a preceding relationship with the components of FIG. 9. For example, first and second dummy gate structures D407a and D407b may correspond to first and second gate structures G4 and G5 of FIG. 9, and preparatory first and second interlayer insulating layers 411a and 411b may correspond to first and second interlayer insulating layers ILD4 and ILD5 of FIG. 9.

Figure 10A:
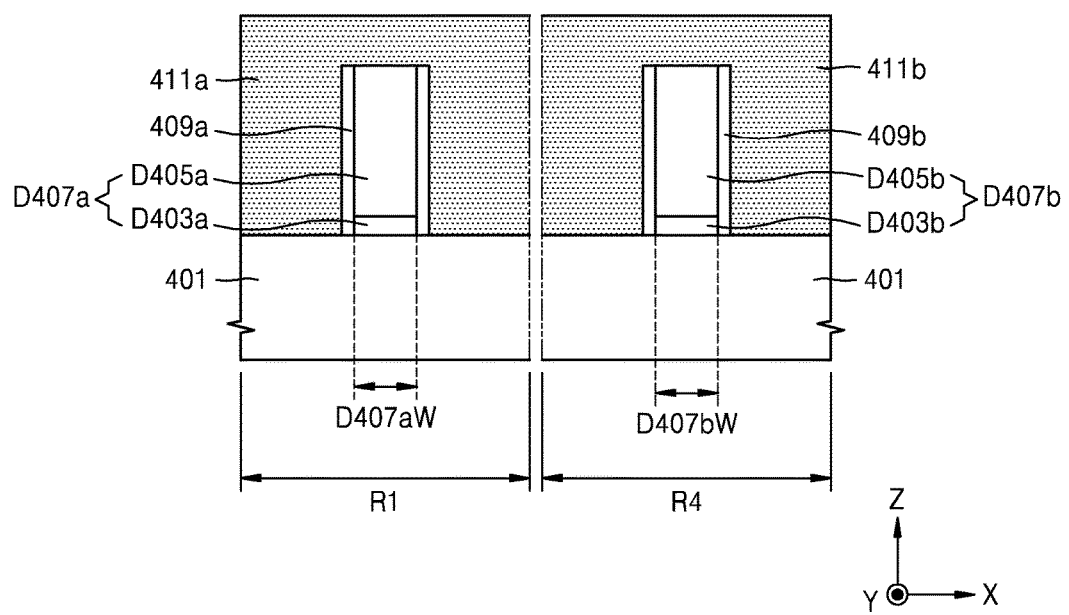

Referring to FIGS. 1, 9, and 10A, the first and second dummy gate structures D407a and D407b may be respectively formed on first and second regions R3 and R4 of the substrate 101 (S101). A first width D407aW of the first dummy gate structure D407a may be the same as a second width D407bW of the second dummy gate structure D407b, but is not limited thereto. The first and second regions R3 and R4 may respectively NMOS and PMOS regions. First and second spacers 409a and 409b may be formed on both side walls, or at least one of the side walls, of the first and second dummy gate structures D407a and D407b.

Thereafter, a preparatory first interlayer insulating layer 411a may be formed on the first region R3 to cover the first dummy gate structure D407a (S103). In more detail, a preparatory first interlayer insulating layer 411a that is inserted between the first spacers 409a on the first region R3 and a sacrificial insulating layer 411b that is inserted between the second spacers 409b on the second region R4 may be contemporaneously or simultaneously formed.

Figure 10B:
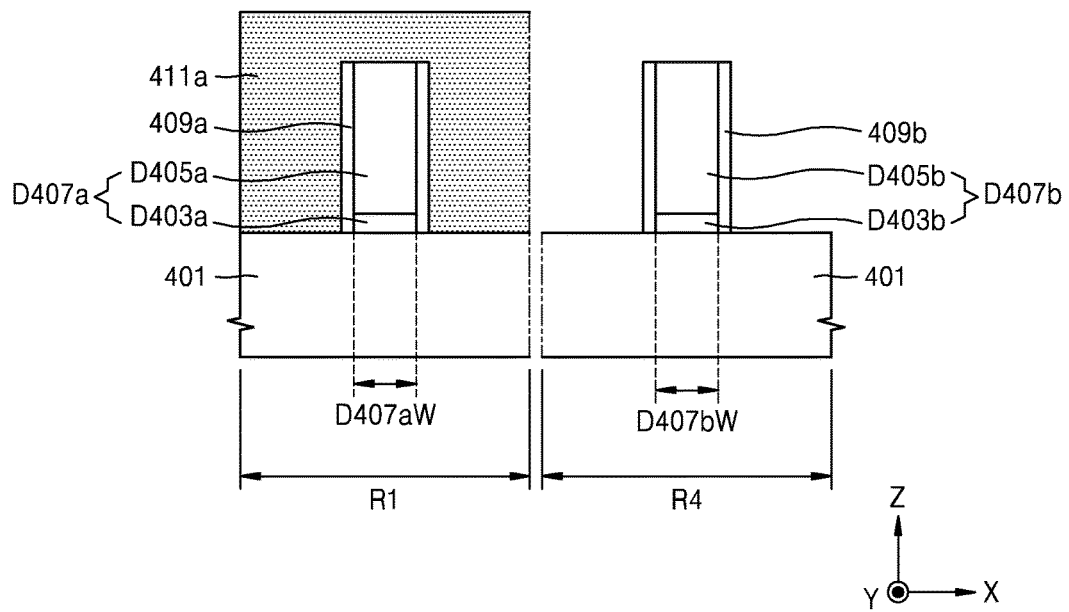

Referring to FIGS. 1, 9, and 10B, the sacrificial insulating layer 411b may be removed from the second region R4.

Figure 10C:
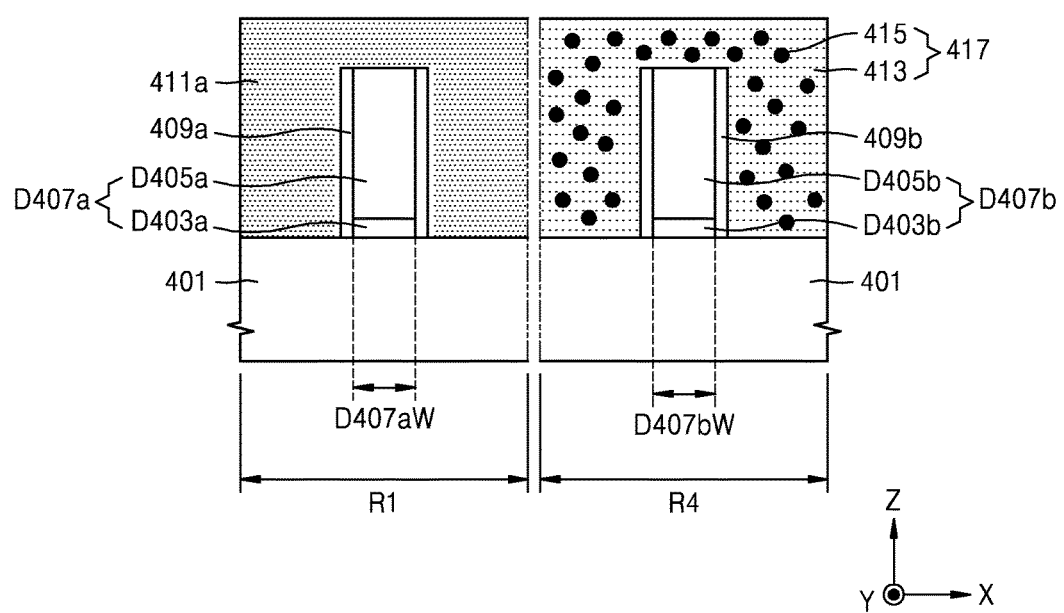

Referring to FIGS. 1, 9, and 10C, a preparatory second interlayer insulating layer 417 may be formed on the second region R4 and be inserted between the second spacers 409b (S105). The preparatory second interlayer insulating layer 417 may include a first colloid. The first colloid may include a first dispersion medium 413 and a first dispersoid 415 dispersed in the first dispersion medium 413.

The first dispersoid 415 may be oxidized through an annealing process and may include materials that may be more bulky than silicon after the annealing process. For example, the first dispersoid 415 may be an IV-group element or an IV-group semiconductor such as silicon (Si), and germanium (Ge) but is not limited thereto. In some example embodiments, the first dispersoid 415 may be a Group III or Group IV element or a compound semiconductor thereof.

Concentration of the first colloid or a quantity of the first dispersoid 415 may be selected according to a stress degree that may be advantageous for a second interlayer insulating layer formed by a subsequent annealing process.

Figure 10D:
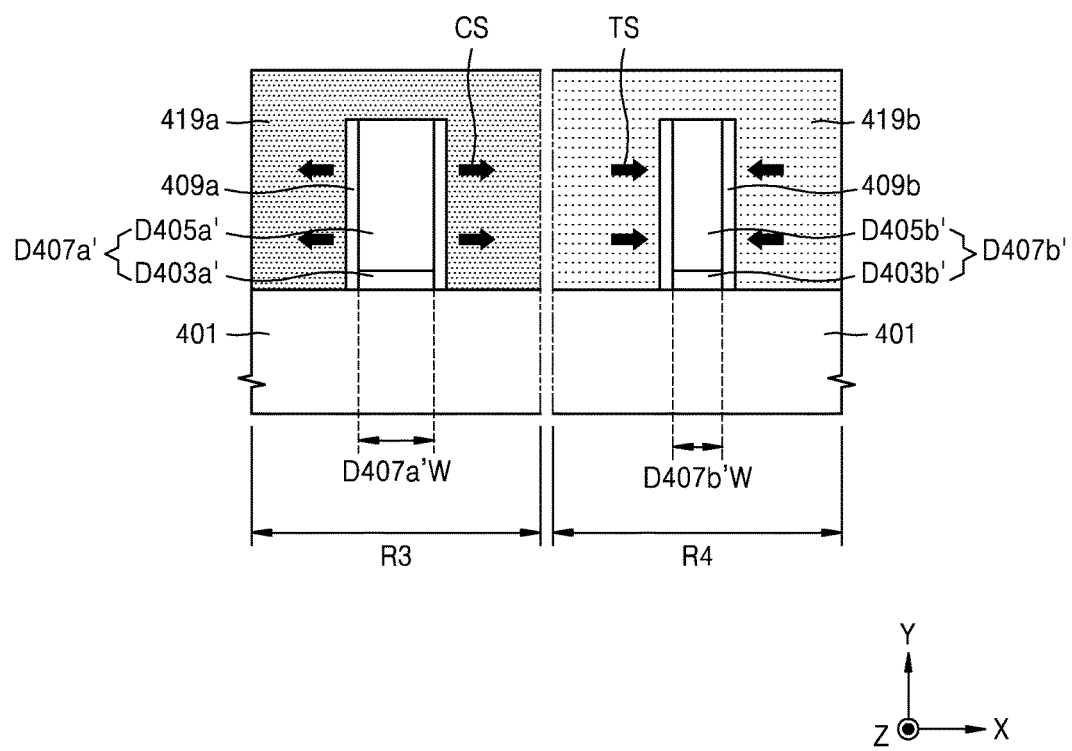

Referring to FIGS. 1, 9, and 10D, the preparatory first and second interlayer insulating layers 411a and 417 of FIG. 10C may be respectively converted into first and second interlayer insulating layers 419a and 419b by annealing a resultant of FIG. 10C (S107).

As described above, the preparatory first and second interlayer insulating layers 411a and 417 of FIG. 10C may be respectively converted into the first and second interlayer insulating layers 419a and 419b through an oxidation reaction in the annealing process. During the annealing process, the first interlayer insulating layer 419a may contract, whereas volume of the second interlayer insulating layer 419b may expand since the dispersion medium 415 is oxidized. That is, during the annealing process, compressive stress (CS) may occur inside the first interlayer insulating layer 419a, and tensile stress (TS) may occur inside the second interlayer insulating layer 419b. Accordingly, TS may be applied to the first dummy gate structure D407a covered by the first interlayer insulating layer 419a, and a width D407a'W of the first interlayer insulating layer 419a may be greater than the width D407aW before the annealing process. Likewise, CS may be applied to the second dummy gate structure D407b covered by the second interlayer insulating layer 419b, and a width D407b'W of the second interlayer insulating layer 419b may be smaller than the width D407bW before the annealing process.

Detailed descriptions of the preparatory first and second interlayer insulating layers 411a and 417 and the first and second interlayer insulating layers 419a and 419b are the same as the preparatory first and second interlayer insulating layers 111a and 117 and the first and second interlayer insulating layers 119a and 119b provided with reference to FIGS. 3A through 3F. For example, the preparatory first interlayer insulating layer 411a may be SOG, and the first interlayer insulating layer 419a may be a silicon oxide layer. A dispersion medium of the preparatory second interlayer insulating layer 417 may be SOG. A dispersoid of the preparatory second interlayer insulating layer 417 may be silicon or a silicon compound. The second interlayer insulating layer 419b may be a high density silicon oxide layer.

Figure 10E:
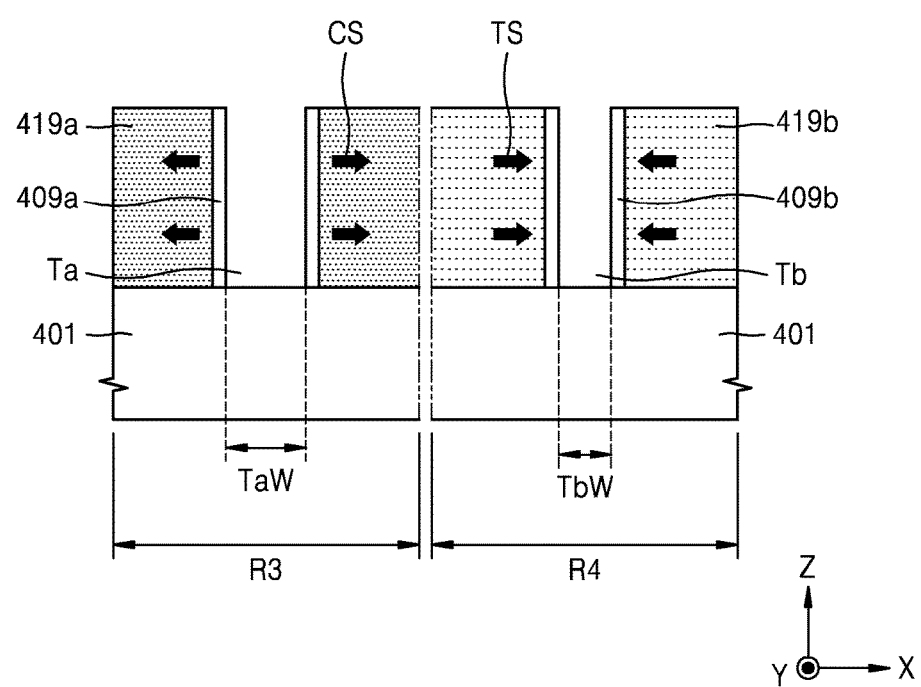

Referring to FIGS. 1, 9, and 10E, a planarization process may be performed on an entire surface including the first and second regions R3 and R4. Thereafter, the exposed first and second dummy gate structures D407a and D407b and first and second spacers 409a and 409b may be removed by using a wet etching method or a dry etching method, and first and second openings Ta and Tb exposing an upper surface of a substrate 401 may be formed. Referring to FIG. 10A, although the widths D407aW and D407bW of the first and second dummy gate structures D407a and D407b are initially the same, a width TaW of the first opening Ta may be greater than a width TbW of the second opening Tb.

Figure 10F:
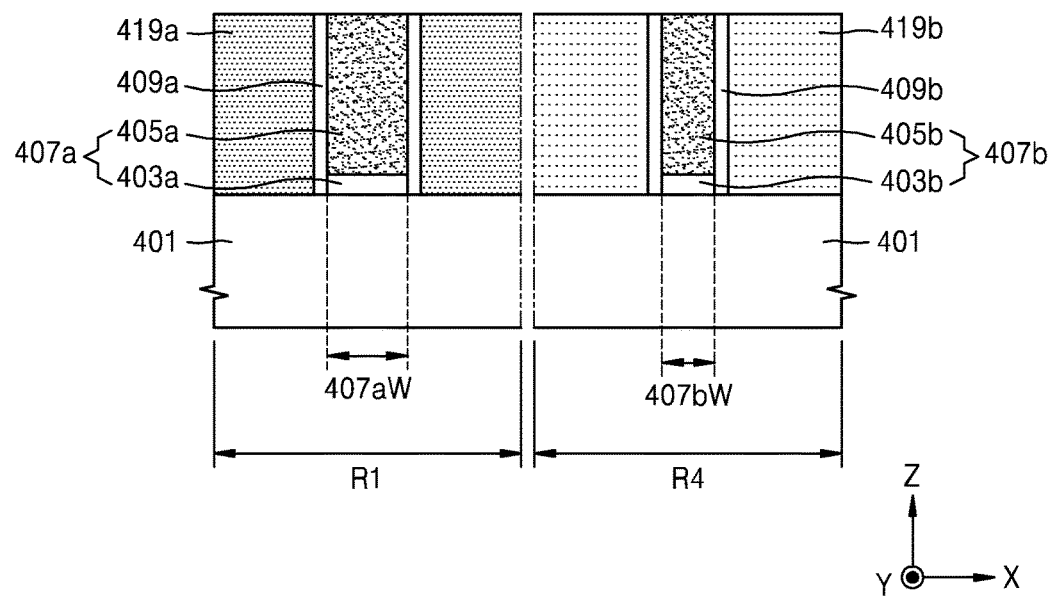

Referring to FIGS. 1, 9, and 10F, first and second gate insulating layers 403a and 403b may be respectively formed in the first and second openings Ta and Tb of the first and second regions R3 and R4, and first and second gate electrode layers 405a and 405b may be respectively formed on the first and second gate insulating layers 403a and 403b. Thereafter, a planarization process may be performed on an entire surface of a resultant, and thus first and second gate structures 407a and 407b having different widths may be formed.

In general, if an annealing process is performed, an interlayer insulating layer may contract, a limited gate structure may be tensile due to the interlayer insulating layer, and a threshold voltage of the gate structure may be reduced. In particular, a threshold voltage determined when a device is designed may be changed during a processing procedure in a PMOS region, which may deteriorate reliability of the device.

However, according to the inventive concepts, the second interlayer insulating layer 419b having TS may be formed in a region in which a reduction in a threshold voltage may present challenges. Accordingly, although an annealing process is performed, CS may be applied to the second gate structure 407b due to TS of the second interlayer insulating layer 419b, thereby inhibiting an extension of the width 407bW of the second gate structure 407b and hindering or preventing the reduction in the threshold voltage. For example, the second interlayer insulating layer 419b may be selectively formed in a PMOS region that is greatly influenced by the reduction in the threshold voltage, and the first interlayer insulating layer 419a may be formed in an NMOS region, thereby improving reliability and performance of the semiconductor device.

Figure 11:
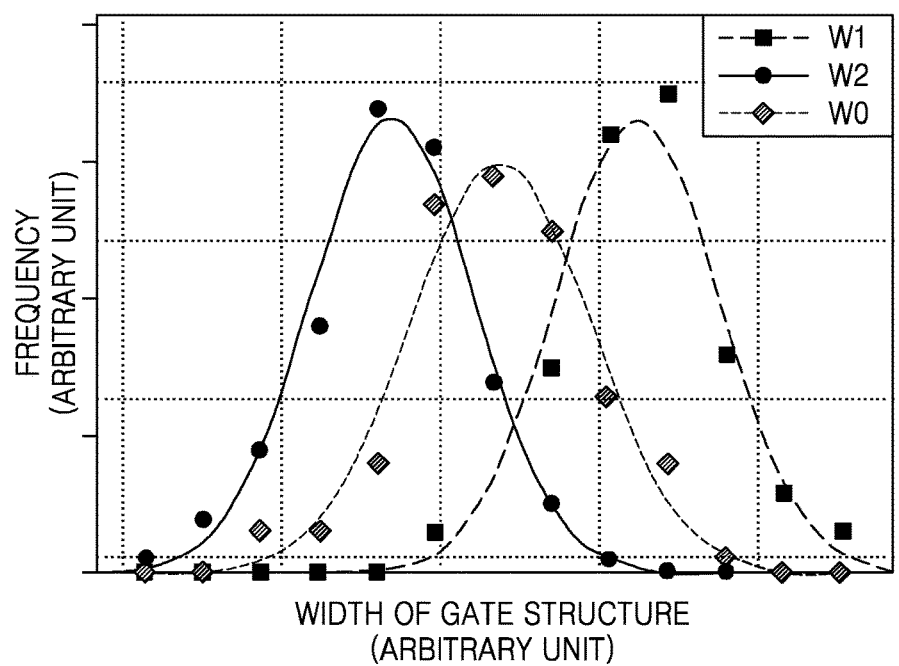
FIG. 11 is a graph showing width distributions of gate structures before and after an annealing process.

FIG. 11 is a graph showing width distributions of gate structures before and after an annealing process.

Referring to FIGS. 10C, 10D, and 11, the width D407aW of the first dummy gate structure D407a and the width D407bW of the second dummy gate structure D407b before the annealing process may have an initial width distribution W0.

After the annealing process, the width D407a'W of a first dummy gate structure D407a' may have a first width distribution W1 that moves right with respect to the initial width distribution W0. That is, after the annealing process, the width D407a'W of the first dummy gate structure D407a' may averagely increase compared to the width D407aW before the annealing process. The width D407b'W of a second dummy gate structure D407b' may have a second width distribution W2 that moves left with respect to the initial width distribution W0. That is, after the annealing process, the width D407b'W of the second dummy gate structure D407b' may averagely decrease compared to the width D407bW before the annealing process.

That is, TS may be formed in the preparatory first interlayer insulating layer 411a that is not based on a colloid through the annealing process, and CS may be formed in the preparatory second interlayer insulating layer 417 including colloid through the annealing process.

Figure 12:
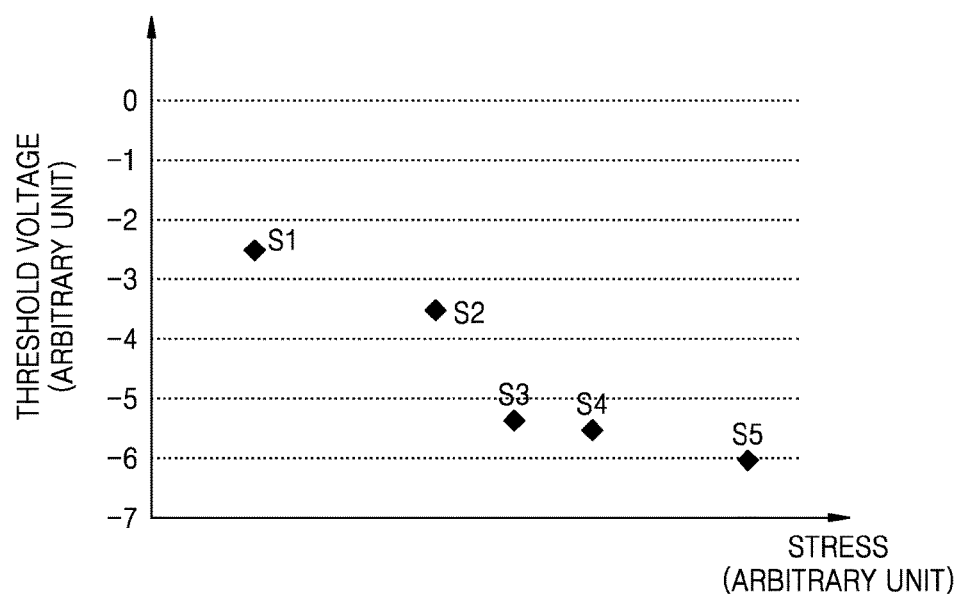
FIG. 12 is a graph showing threshold voltages of a gate structure with respect to stress applied to an interlayer insulating layer.

FIG. 12 is a graph showing threshold voltages of a gate structure with respect to stress applied to an interlayer insulating layer.

Referring to FIG. 12, CS of an interlayer insulating layer is about −3.2 Gpa and a threshold voltage of a gate structure formed in the interlayer is about −2.5 in an experiment example 1 S1. Likewise, CS of an interlayer insulating layer is about −1.8 Gpa and a threshold voltage of a gate structure formed in the interlayer is about −3.5 in an experiment example 2 S2. CS of an interlayer insulating layer is about −1.2 Gpa and a threshold voltage of a gate structure formed in the interlayer is about −5.4 in an experiment example 3 S3. CS of an interlayer insulating layer is about −0.6 Gpa and a threshold voltage of a gate structure formed in the interlayer is about −5.5 in an experiment example 4 S4. CS of an interlayer insulating layer is about 0.6 Gpa and a threshold voltage of a gate structure formed in the interlayer is about −6 in an experiment example 5 S5.

That is, as CS increases in an interlayer insulating layer, a threshold voltage of a gate structure may be reduced. According to the inventive concepts, an interlayer insulating layer based on a colloid may be formed, and thus TS may be applied to a gate structure formed in the interlayer insulating layer, thereby inhibiting a reduction in a threshold voltage of the gate structure.

Figure 13:
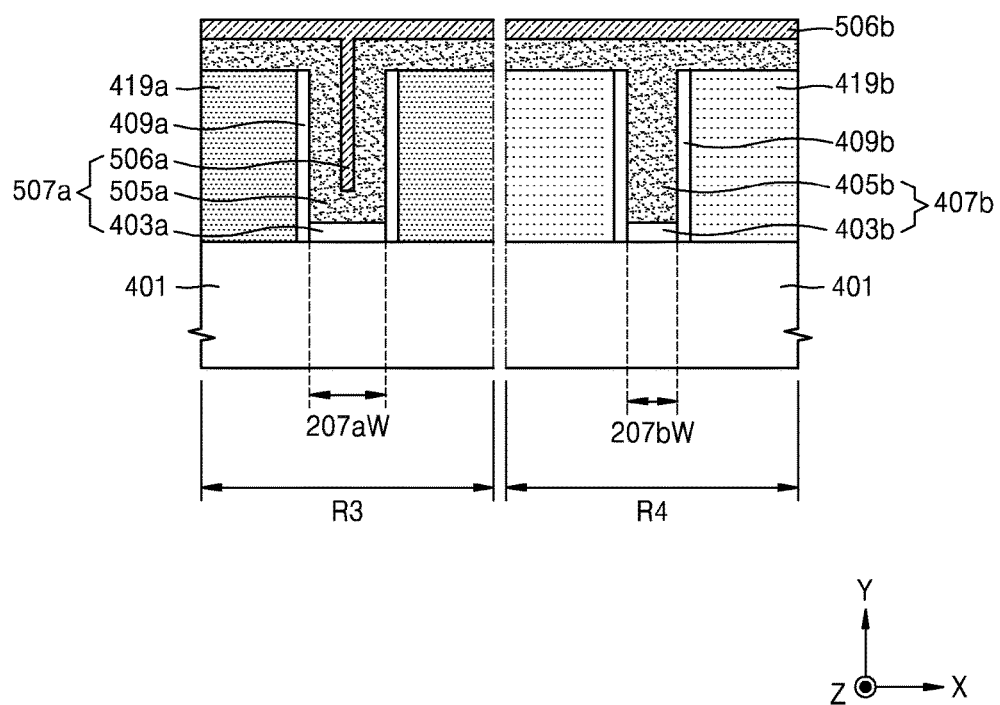

FIG. 13 is a cross-sectional view for describing a method of manufacturing a semiconductor device, according to other example embodiments, wherein FIG. 13 is a cross-sectional view taken along lines C-C and D-D of FIG. 9. FIG. 13 may have manufacturing operations of FIGS. 10A through 10E as a preceding process.

Referring to FIGS. 10A through 10E and 13, the first and second gate insulating layers 403a and 403b may be respectively formed in the first and second openings Ta and Tb of the first and second regions R3 and R4.

Thereafter, first and second gate electrode layers 505a and 505b may be formed on the first and second gate insulating layers 403a and 403b to conformally cover lower and inner surfaces of the first and second openings Ta and Tb. In this regard, since the width TaW of the first opening Ta is greater than the width TbW of the second opening Tb, the second opening Tb may be partially or completely buried by the second gate electrode layer 505b, whereas the first opening Ta may not be completely buried. A third gate electrode layer 506a may be further formed in a space of the first opening Ta that is not completely buried by the first gate electrode layer 505a. The first and second gate electrode layers 505a and 505b may include a gate electrode layer material described with reference to FIG. 3G. The third gate electrode layer 506a may include W or Al having an excellent gap-fill characteristic.

Thereafter, a planarization process may be performed on an entire surface of a resultant, and thus first and second gate structures having different widths and structures may be formed.

Figure 14A:
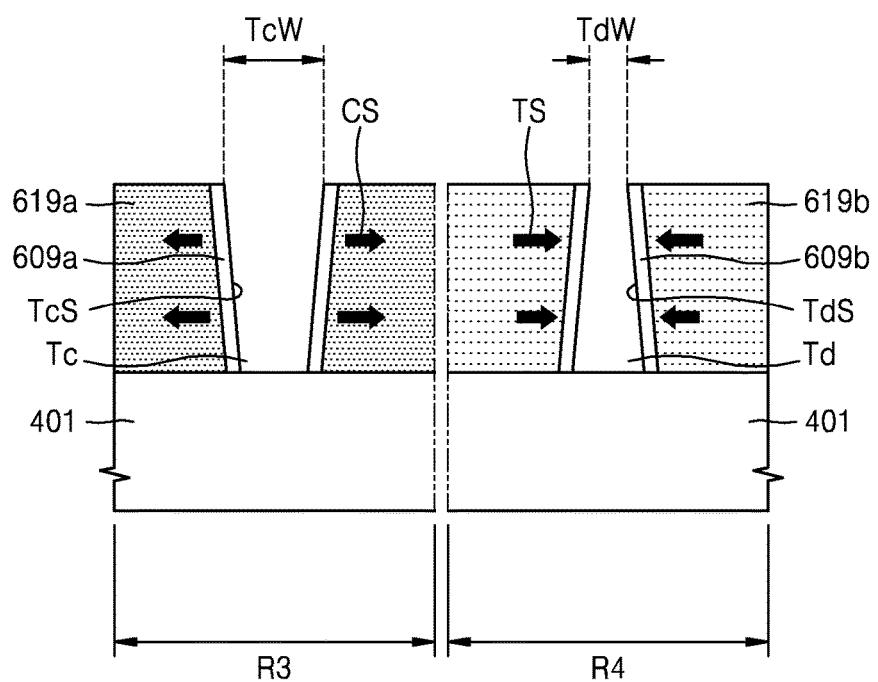
Figure 14B:
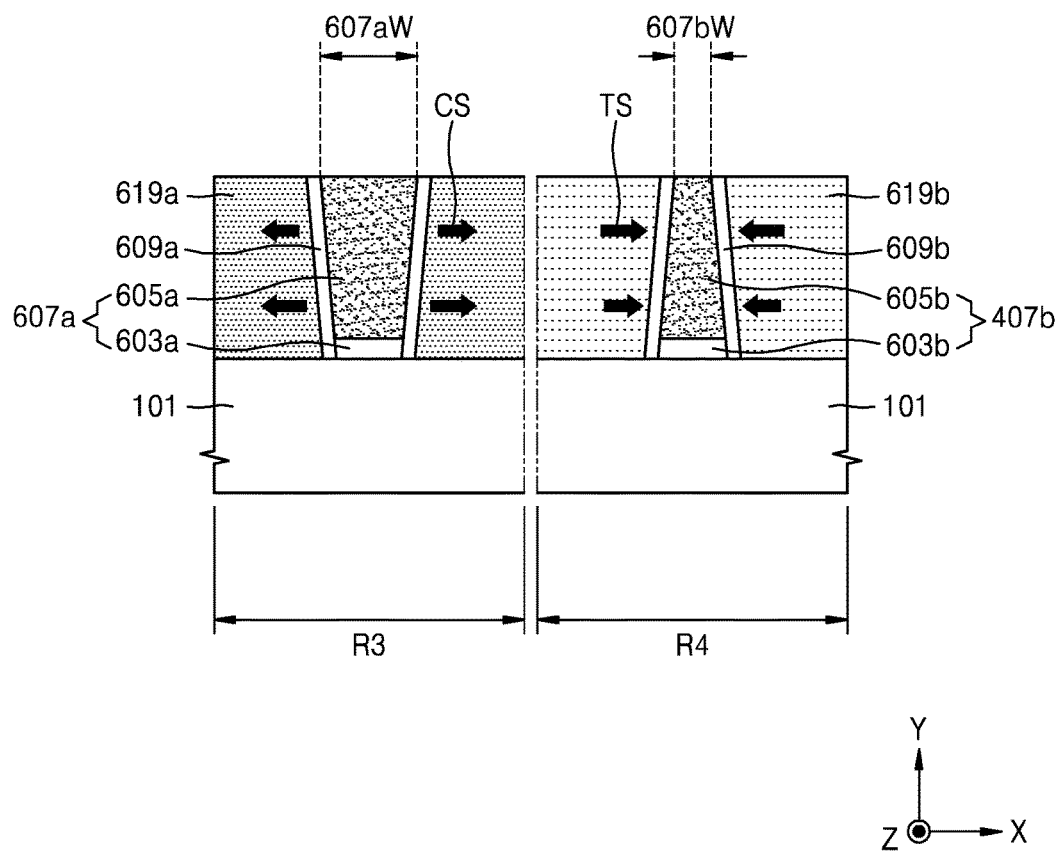

FIGS. 14A and 14B are cross-sectional views for sequentially describing a method of manufacturing a semiconductor device, according to other example embodiments, wherein FIGS. 14A and 14B are cross-sectional views taken along lines C-C and D-D of FIG. 9.

Referring to FIGS. 10D, 10E, and 14A, first and second interlayer insulating layers 619a and 619b may be formed by annealing a resultant of FIG. 10C. During an annealing process, CS may be generated inside the first interlayer insulating layer 619a, and TS may be generated inside the second interlayer insulating layer 619b.

First and second openings Tc and Td may be formed by removing the first and second dummy gate structures D407a and D407b of FIG. 10E. After the annealing process, shapes of the first and second openings Tc and Td may be modified.

In some example embodiments, inner surfaces of the first and second openings Tc and Td formed by removing the first and second dummy gate structures D407a and D407b of FIG. 10E may have different inclinations. The inner surfaces of the first and second openings Tc and Td may be side surfaces of first and second spacers 609a and 609b. A width of the first opening Tc to which CS is applied may have a tapering shape. A width of the second opening Td to which TS is applied may have a flaring shape. That is, an upper width TcW of the first opening Tc may be greater than an upper width TdW of the second opening Td.

Referring to FIG. 14B, first and second gate insulating layers 603a and 603b may be respectively formed in the first and second openings Tc and Td. Thereafter, first and second gate electrode layers 605a and 605b may be respectively formed in the first and second gate insulating layers 603a and 603b. Thereafter, a planarization process may be performed on an entire surface of a resultant, and thus first and second gate structures 607a and 607b having different widths and structures may be formed. In this regard, an upper width 607aW of the first gate structure 607a may be greater than an upper width 607bW of the second gate structure 607b.

Figure 15A:
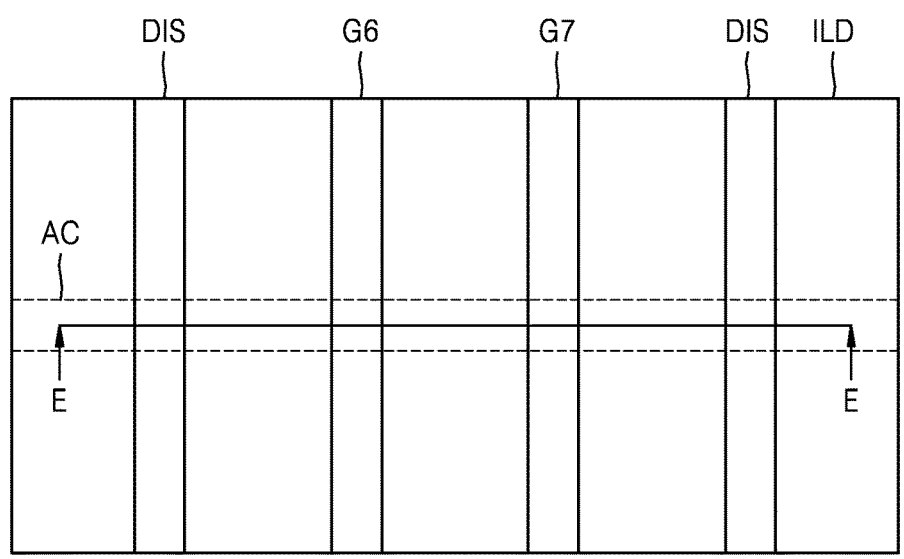
FIGS. 15A and 15B are schematic layout and perspective view of a semiconductor device according to other example embodiments.
Figure 15A:
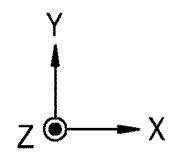
Figure 15B:
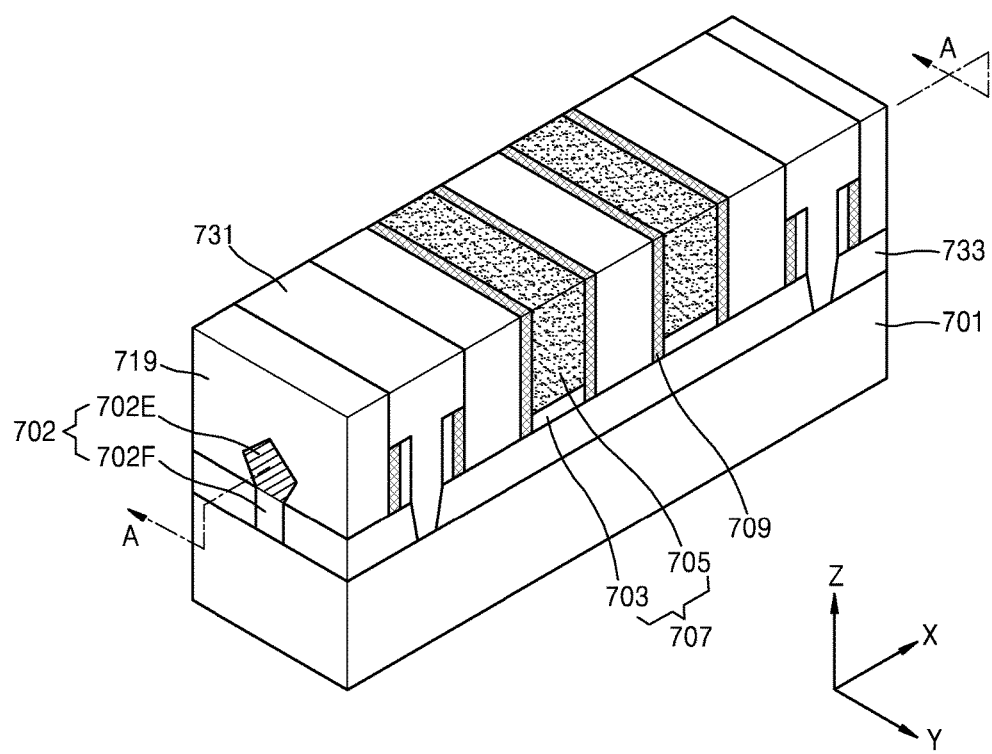

FIGS. 15A and 15B are schematic layout and perspective view of a semiconductor device according to other example embodiments. FIGS. 15A and 15B are schematic layout and perspective view of the semiconductor device manufactured by using a method of FIGS. 16A through 16G.

FIGS. 16A through 16G are cross-sectional views for sequentially describing a method of manufacturing a semiconductor device, according to other example embodiments, wherein FIGS. 16A through 16G are cross-sectional views taken along a line E-E of FIGS. 15A and 15B. FIG. 15A is a layout of the semiconductor device manufactured by using the method of FIGS. 16A through 16G, and thus components of FIGS. 16A through 16G may not be the same as the components of FIG. 15A. The components of FIGS. 16A through 16G may have a preceding relationship with the components of FIG. 15A. For example, first through fourth dummy gate structures DG1 through DG4 and a preparatory interlayer insulating layer 717 may correspond to a first device isolation structure DIS, a first gate structure G6, a second gate structure G7, the first device isolation structure DIS, and an interlayer insulating layer ILD of FIG. 15A.

Figure 16A:
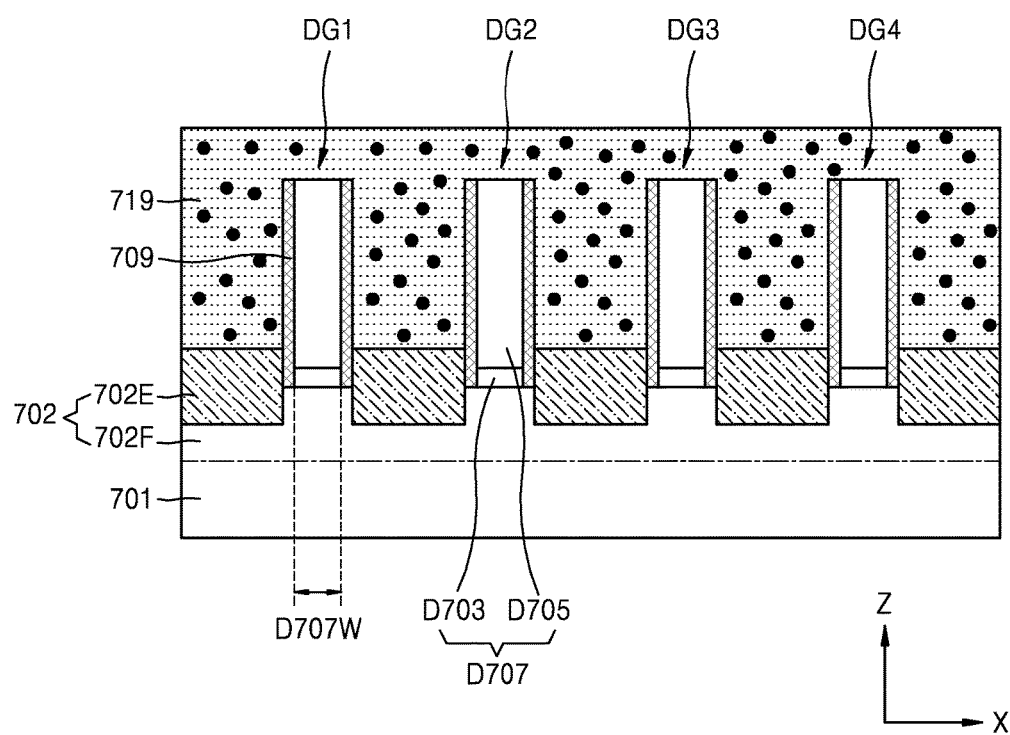

Referring to FIGS. 15A, 15B, and 16A, an active area having a fin 702 may be formed on a substrate 701. The fin 702 may protrude from the substrate 701 and extend in a first direction (X direction).

The fin 702 may include a lower fin 702F and an upper fin 702E. The lower fin 702F may be formed based on the substrate 701. The upper fin 702E may include an epitaxial layer grown in the lower fin 702F. The upper fin 702E may constitute a source/drain region. The lower fin 702F may constitute a channel region in a lower portion of a gate structure 707 that will be described below. The upper fin 702E may have various shapes. For example, the upper fin 702E may have various shapes such as a diamond, a circle, an oval, a polygon, etc. on a cross-section perpendicular to the first direction (X direction).

A device isolation layer 733 may be formed on the substrate 701. The device isolation layer 733 may surround both side surfaces, or at least one of the side surfaces, of the lower fin 702E of the fin 702. The device isolation layer 733 may not be shown in FIG. 16A. The device isolation layer 733 may electrically isolate fins arranged in a second direction (Y direction). The device isolation layer 733 may include at least one of a silicon oxide layer, a silicon nitride layer, a silicon oxynitride layer, and a combination thereof. The upper fin 702E of the fin 702 may not be surrounded by the device isolation layer 733 and may have a protruding structure. The first through fourth dummy gate structures DG1 through DG4 may extend in the second direction (Y direction) across the fin 702 and may be arranged in the first direction (X direction). The first through fourth dummy gate structures DG1 through DG4 may include a dummy gate insulating layer D703 and a dummy gate electrode layer D705. Both side walls, or at least one of the side walls, of the first through fourth dummy gate structures DG1 through DG4 may be covered by spacers 709.

A preparatory interlayer insulating layer 717 burying between the spacers 709 may be formed. The preparatory interlayer insulating layer 717 may include colloid. The colloid may include a dispersion medium 713 and a dispersoid 715 that is dispersed in the dispersion medium 713.

The dispersoid 715 may be oxidized through an annealing process and may include materials that may be more bulky than silicon after the annealing process. For example, the first dispersoid 715 may be an IV-group element or an IV-group semiconductor such as silicon (Si), and germanium (Ge) but is not limited thereto. In some example embodiments, the first dispersoid 715 may be a Group III or Group IV element or a compound semiconductor thereof.

Concentration of the colloid or a quantity of the first dispersoid 715 may be selected according to a stress degree that may be advantageous for an interlayer insulating layer formed by a subsequent annealing process.

Figure 16B:
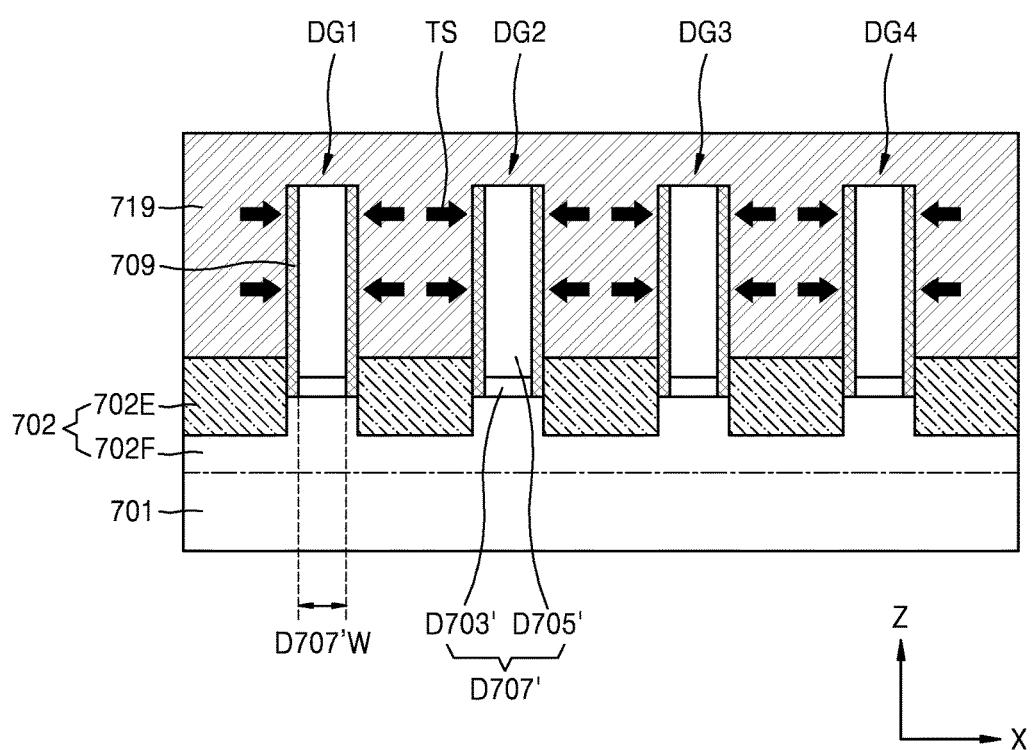

Referring to FIGS. 15A, 15B, and 16B, the preparatory interlayer insulating layer 717 of FIG. 16A may be converted into an interlayer insulating layer 719 by annealing a resultant of FIG. 16A.

As described above, the preparatory interlayer insulating layer 717 of FIG. 16A may be converted into the interlayer insulating layer 719 through an oxidation reaction in the annealing process. During the annealing process, volume of the preparatory interlayer insulating layer 717 may expand since the dispersion medium 715 is oxidized. That is, during the annealing process, TS may occur inside the preparatory interlayer insulating layer 717. Accordingly, TS may be applied to the first through fourth dummy gate structures DG1 through DG4 covered by the interlayer insulating layer 719, and a width D707a'W of each, or at least one, of the first through fourth dummy gate structures DG1 through DG4 may be smaller than the width D707W of FIG. 16A before the annealing process. Accordingly, a reduction in a threshold voltage of the gate structures DG2 and DG3 that will be described below may be hindered or prevented.

The first through fourth dummy gate structures DG1 through DG4 may commonly have a dummy gate insulating layer D703 and a dummy gate structure D707 including a dummy gate electrode layer D705. After the annealing process, the first through fourth dummy gate structures DG1 through DG4 may commonly have a dummy gate insulating layer D703' and a dummy gate structure D707' including a dummy gate electrode layer D705'.

Figure 16C:
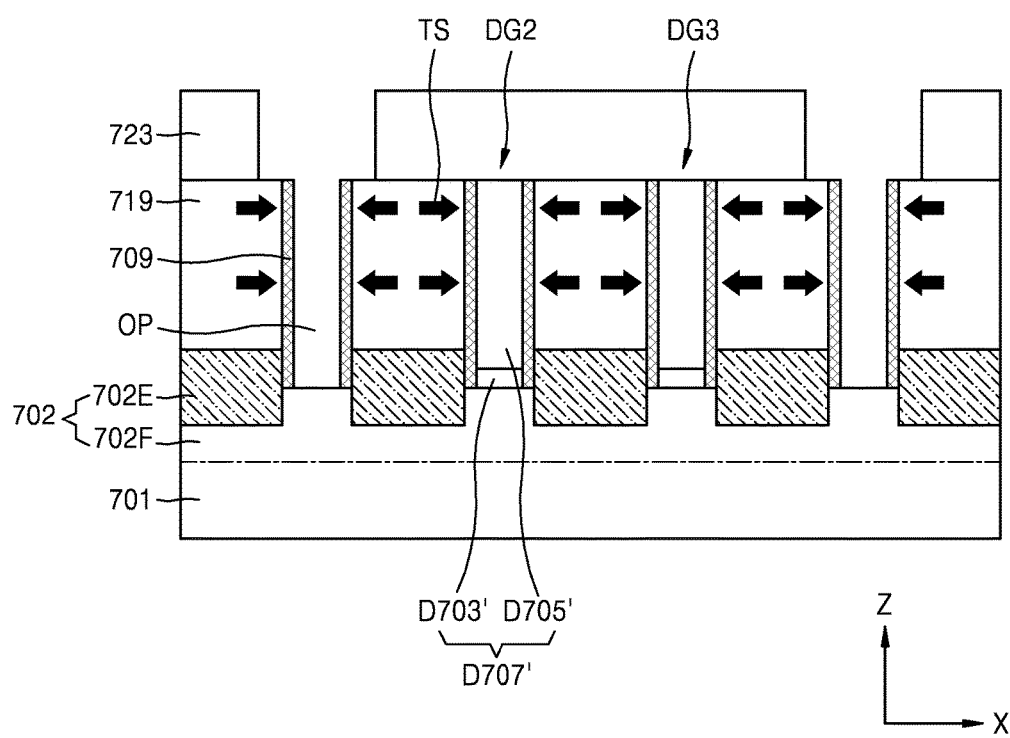

Referring to FIGS. 15A, 15B, and 16C, a mask pattern 723 exposing upper surfaces of the first and fourth dummy gate structures DG1 and DG4 of FIG. 16B may be formed. An opening OP exposing an upper surface of the substrate 701 may be formed by removing the first and fourth dummy gate structures DG1 and DG4 exposed by the mask pattern 723.

Figure 16D:
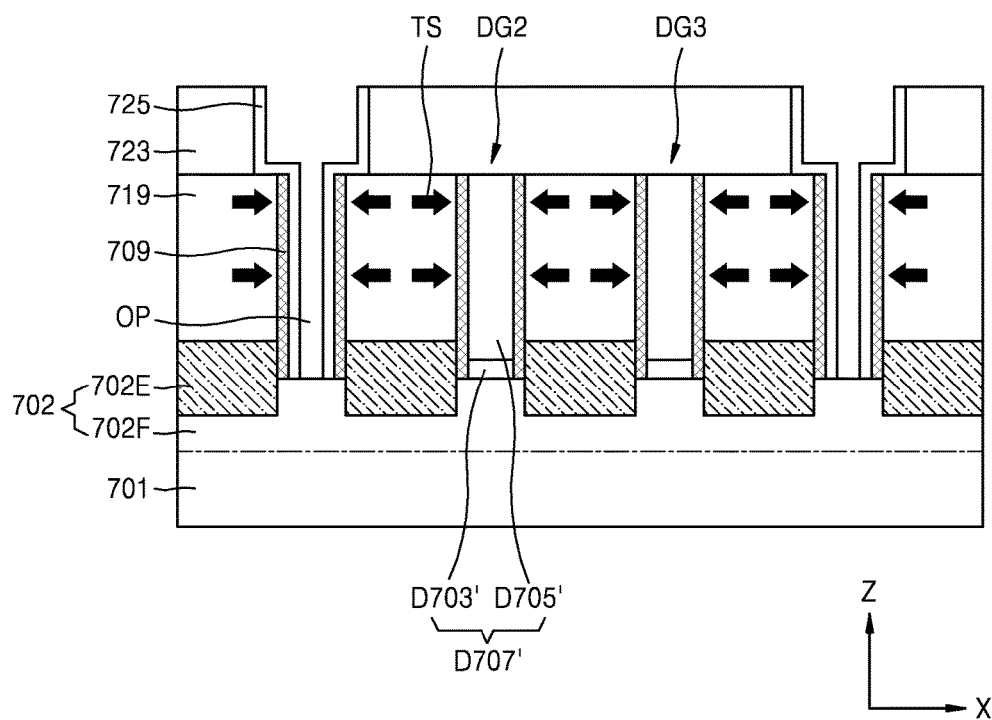

Referring to FIGS. 15A, 15B, and 16D, a liner 725 covering inner walls of the opening OP and the mask pattern 723 may be formed. The liner 725 may be a silicon nitride layer or a silicon oxynitride layer but is not limited thereto.

Figure 16E:
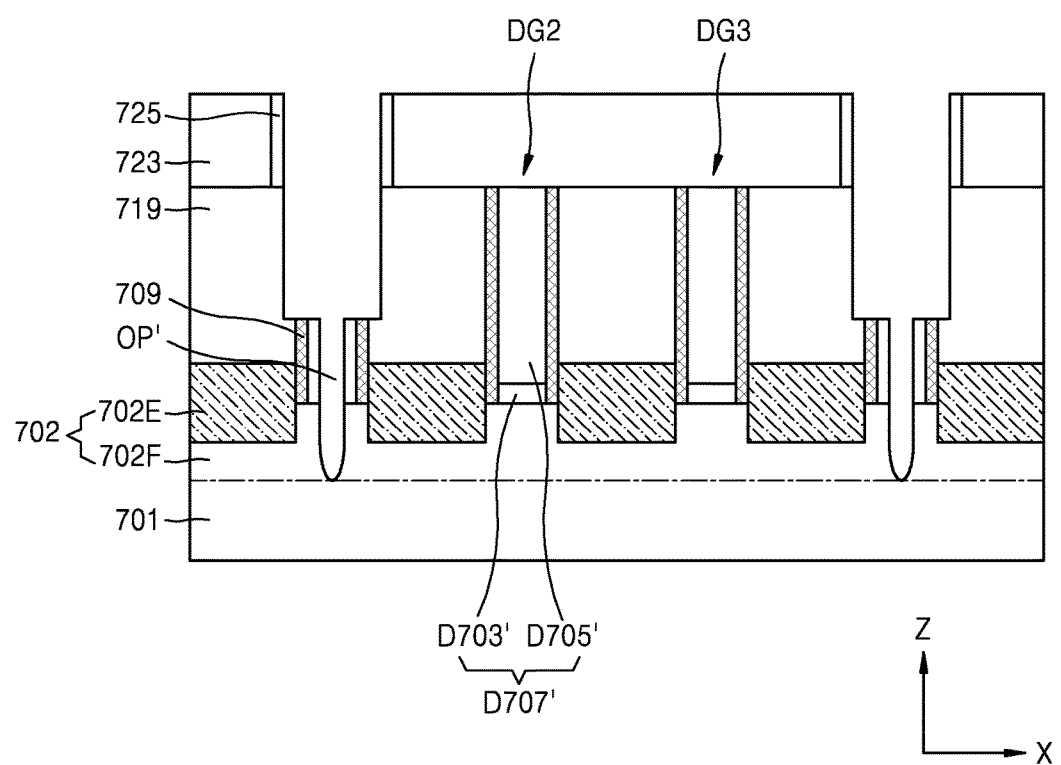

Referring to FIGS. 15A, 15B, and 16E, a device isolation trench OP' may be formed by etching the preparatory interlayer insulating layer 719 and the substrate 701 by using the mask pattern 723 on which the line 725 is formed as an etching mask.

Figure 16F:
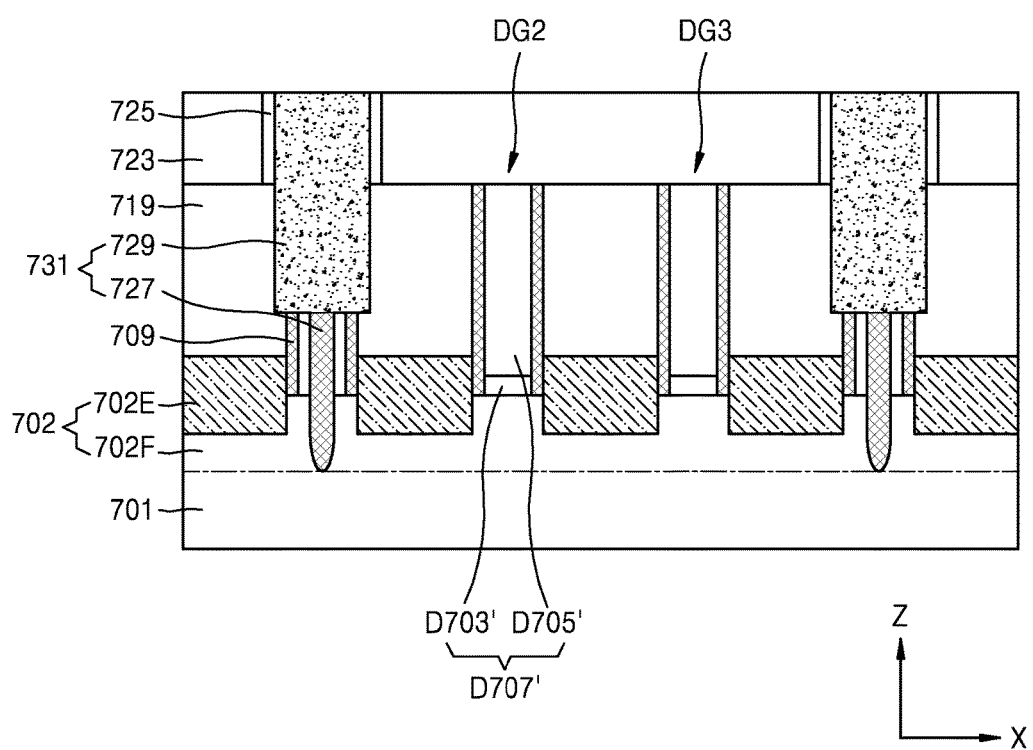

Referring to FIGS. 15A, 15B, and 16F, a device isolation structure 731 may be formed by filling the device isolation trench OP' with an insulating material. The device isolation structure 731 may be formed by penetrating into the interlayer insulating layer 719 through the substrate 701. A material of the device isolation structure 731 may be a material of the preparatory first interlayer insulating layer 111a described with reference to FIG. 3C. In some example embodiments, the material of the device isolation structure 731 may be the same as that of a dispersion medium of the interlayer insulating layer 719. In some example embodiments, the device isolation structure 731 may have a multilayer structure including a first layer 727 and a second layer 729. The first and second layers 727 and 729 may be selected according to a gap-fill or stress characteristic of an insulating material.

Figure 16G:
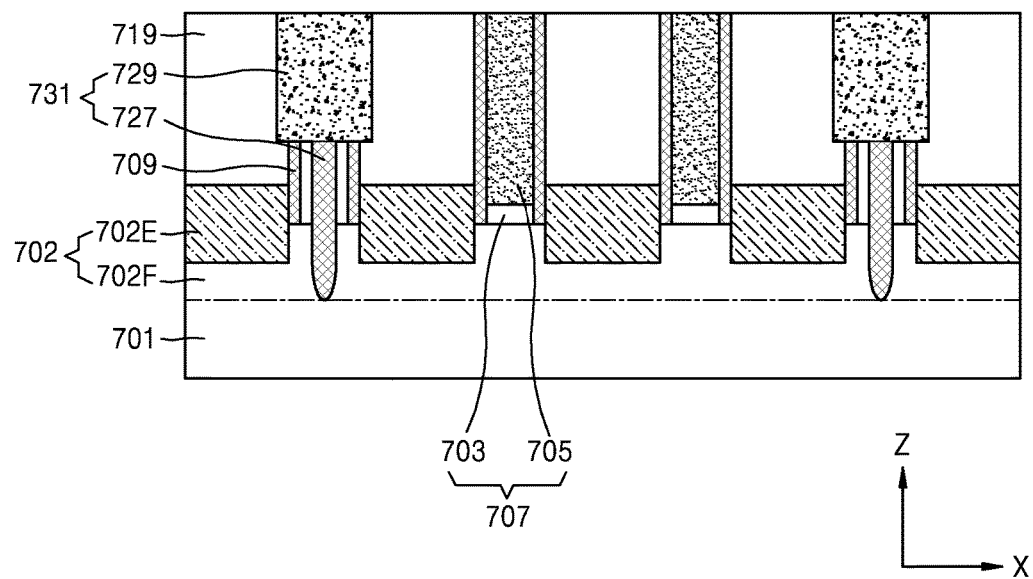

Referring to FIGS. 15A, 15B, and 16G, upper surfaces of the second and third dummy gate structures G2 and G3 may be exposed by planarizing a resultant of FIG. 16F, and an opening may be formed by removing the second and third dummy gate structures G2 and G3. The gate insulating layer 703 and the gate electrode layer 705 may be formed, for example sequentially formed, in the opening, and thus the gate structure 707 may be formed.

According to the inventive concepts, the interlayer insulating layer 719 having TS may be formed in a region in which a reduction in a threshold voltage may present challenges. Accordingly, although an annealing process is performed, an extension of widths of the second and third dummy gate structures G2 and G3 may be inhibited, thereby hindering or preventing the reduction in the threshold voltage. Contemporaneously or simultaneously, the device isolation structure 731 may be formed by using a self-aligning method using the first and second dummy gate structures DG1 and DG2, thereby easily forming a device isolation structure even in a fine pattern.

Figure 17:
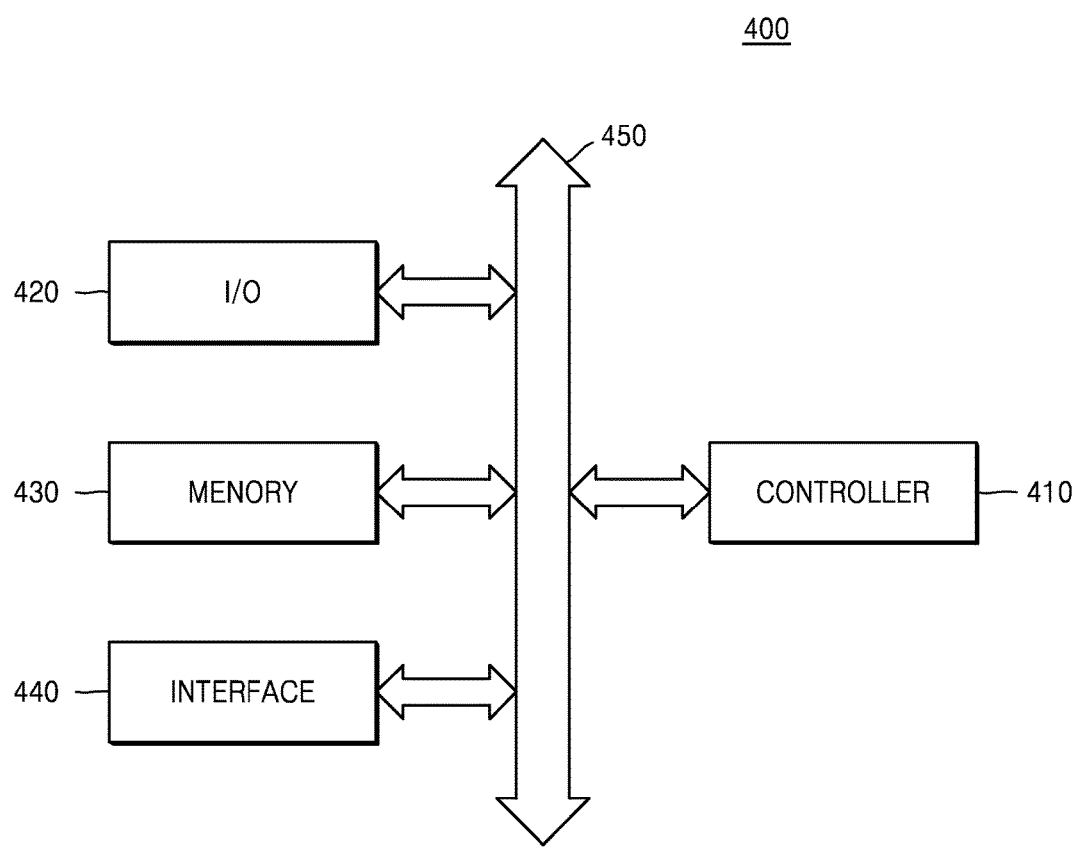
FIG. 17 is a block diagram of an electronic system including a semiconductor device according to other example embodiments.

FIG. 17 is a block diagram of an electronic system 400 including a semiconductor device according to other example embodiments.

Referring to FIG. 17, the electronic system may include a controller 410, an input/output device I/O 420, a memory 430, an interface 440, and a bus 450. The controller 410, the input/output device I/O 420, the memory 430, and/or the interface 440 may be connected to each other via the bus 450. The bus 450 may correspond to a path through which a plurality of pieces of data can move.

The controller 410 may include at least one of a microprocessor, a digital signal processor, a micro-controller, and logic devices that may perform functions that are similar or the same thereto. The input/output device I/O 420 may include a key pad, a key board, a display device, etc. The memory 430 may store data and/or commands, etc. The interface 440 may transmit or receive data to or from a communication network. The interface 440 may be a wired or wireless form. For example, the interface 440 may include an antenna or a wired/wireless transceiver, etc.

Although not shown, the electronic system 400 may be an operation memory for improving an operation of the controller 410 and may further include a high speed DRAM and/or SRAM, etc. The semiconductor device formed by using a method of manufacturing the semiconductor device according to the example embodiments may be provided to the memory 430 or may be provided as a part such as the controller 410, the input/output device I/O 420, etc.

The electronic system 400 may be applied to a personal digital assistant (PDA), a portable computer, a web tablet, a wireless phone, a mobile phone, a digital music player, a memory card, or electronic products that may transmit and/or receive information in a wireless environment.

Figure 18:
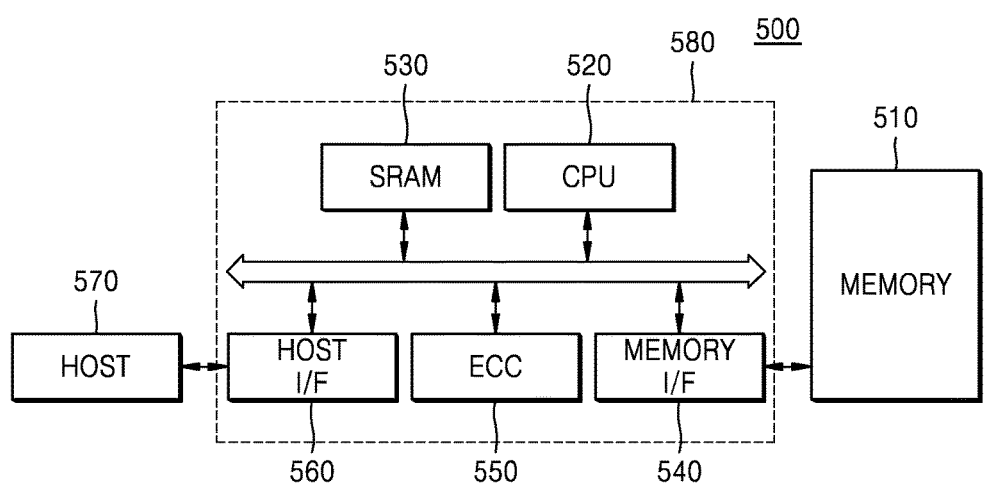
FIG. 18 is a block diagram of an electronic system including a semiconductor device according to other embodiments.

FIG. 18 is a block diagram of an electronic system 500 including a semiconductor device according to other example embodiments.

Referring to FIG. 18, the electronic system 500 may be a memory card. The electronic system may include a memory 510 and a memory controller 580. The memory controller 580 may control a data exchange between a host 570 and the memory 510. The memory 510 and the memory controller 580 may include the semiconductor device formed by using a method of manufacturing the semiconductor device according to the example embodiments.

The memory controller 580 may include an SRAM 530, a CPU 520, a host interface 560, an ECC 550, and a memory interface 540. The SRAM 530 may be used as an operation memory of the CPU 520. The host interface 560 may include a protocol for exchanging data when the host 570 accesses the electronic system 500. The ECC 550 may detect and correct an error of data read from the memory 510. The memory interface 540 may interface input/output of data with the memory 510. The CPU 520 may perform general control operations relating to the data exchange of the memory controller 580.

While the inventive concepts have been particularly shown and described with reference to example embodiments thereof, it will be understood that various changes in form and details may be made therein without departing from the spirit and scope of the following claims.

What is claimed is:

1. A method of manufacturing a semiconductor device, the method comprising:
   forming first and second pattern structures on first and second regions of a substrate, respectively;
   forming a preparatory first interlayer insulating layer covering the first pattern structure on the first region;
   forming a preparatory second interlayer insulating layer covering the second pattern structure on the second region, the preparatory second interlayer insulating layer including a first colloid; and
   converting the preparatory first and second interlayer insulating layers into first and second interlayer insulating layers, respectively, by annealing the preparatory first and second interlayer insulating layers,
   wherein the preparatory first interlayer insulating layer comprises a second colloid different from the first colloid,
   wherein each of the first colloid and the second colloid comprises a dispersoid and a dispersion medium surrounding the dispersoid, and
   wherein a material of the dispersion medium of the first colloid is the same as a material of the dispersion medium of the second colloid.

2. The method of claim 1, wherein a density of the second interlayer insulating layer is higher than a density of the first interlayer insulating layer.

3. The method of claim 1, further comprising: after converting the preparatory first and second interlayer insulating layers into the first and second interlayer insulating layers, respectively,
   planarizing the first and second interlayer insulating layers to have upper surfaces thereof lower than upper surfaces of the first and second pattern structures; and
   forming a third interlayer insulating layer covering the upper surfaces of the first and second interlayer insulating layers and side surfaces of the first and second pattern structures,
   wherein a level of the upper surface of the first interlayer insulating layer is the same as a level of the upper surface of the second interlayer insulating layer.

4. The method of claim 3, wherein
   the first pattern structure and the second pattern structure include a plurality of first pattern structures and a plurality of second pattern structures, respectively,
   a first pattern density of the plurality of first pattern structures is higher than a second pattern density of the plurality of second pattern structures, or
   a first space between adjacent first pattern structures is smaller than a second space between adjacent second pattern structures.

5. The method of claim 1, wherein
   a density of the first interlayer insulating layer formed by annealing the preparatory first interlayer insulating layer is lower than a density of the second interlayer insulating layer.

6. The method of claim 1, wherein
   a concentration of the second colloid is lower than a concentration of the first colloid.

7. The method of claim 1, wherein
   each of the first and second regions comprises fins protruding from an upper surface of the substrate and extending in one direction, and
   the first and second pattern structures intersect the fins in the first and second regions, respectively.

8. The method of claim 1, wherein
   the first and second pattern structures include first and second dummy gate structures, respectively,
   before annealing the preparatory first and second interlayer insulating layers, a first opening of the preparatory first interlayer insulating layer delimiting the first dummy gate structure has the same shape as a second opening of the preparatory second interlayer insulating layer delimiting the second dummy gate structure, and
   after annealing the preparatory first and second interlayer insulating layers, the first and second openings are modified to have different shapes.

9. The method of claim 8, further comprising:
   after annealing the preparatory first and second interlayer insulating layers, forming first and second gate structures in the modified first and second openings, respectively,
   wherein a width of the second gate structure is smaller than a width of the first gate structure.

10. The method of claim 8, further comprising:
    after annealing the preparatory first and second interlayer insulating layers, forming first and second gate structures in the modified first and second openings, respectively,
    wherein an inclination of side surfaces of the first gate structure is different from an inclination of side surfaces of the second gate structure.

11. The method of claim 1, wherein
    a concentration of the second colloid is lower than a concentration of the first colloid, or a thermal expansivity of the second colloid is lower than a thermal expansivity of the first colloid.

12. The method of claim 1, wherein the first and second pattern structures include first and second dummy gate structures, respectively, and the second dummy gate structure includes a plurality of second dummy gate structures, the method further including, after annealing the preparatory first and second interlayer insulating layers,
forming an opening exposing the substrate by removing at least one of the plurality of second dummy gate structures;
forming a device isolation trench by etching the substrate exposed by the opening; and
forming a device isolation structure by filling the device isolation trench and the opening.

13. The method of claim 12, wherein the device isolation structure comprises the same material as a dispersion medium of the preparatory second interlayer insulating layer.

14. A method of manufacturing a semiconductor device, the method comprising:
forming a preparatory first interlayer insulating layer on a first region of a substrate, the preparatory first interlayer insulating layer delimiting a first pattern structure;
forming a preparatory second interlayer insulating layer on a second region of the substrate, the preparatory second interlayer insulating layer delimiting a second pattern structure and including a first colloid; and
converting the preparatory first and second interlayer insulating layers into first and second interlayer insulating layers, respectively, by annealing the preparatory first and second interlayer insulating layers,
wherein at least one of a density and a thermal expansivity of the second interlayer insulating layer is higher than at least one of a density and a thermal expansivity, respectively, of the first interlayer insulating layer, and
wherein the preparatory first interlayer insulating layer comprises a second colloid different from the first colloid,
wherein the first colloid includes a dispersion medium and a dispersoid surrounding the dispersion medium,
wherein a material of the dispersion medium is the same as a material of the preparatory first interlayer insulating layer,
wherein a material of the dispersion medium of the first colloid is the same as a material of the dispersion medium of the second colloid.

15. A method comprising:
forming a pattern structure on a substrate, the pattern structure including a first pattern structure and a second pattern structure, a pattern density of the second pattern structure being lower than a pattern density of the first pattern structure;
forming a preparatory first interlayer insulating layer on the first pattern structure, the preparatory first interlayer insulating layer including a second colloid;
forming a first interlayer insulating layer on the first pattern structure;
forming a preparatory second interlayer insulating layer on the second pattern structure, the preparatory second interlayer insulating layer including a first colloid, the second colloid different from the first colloid;
annealing the preparatory first interlayer insulating layer and the preparatory second interlayer insulating layer to form a second interlayer insulating layer; and
planarizing the first and second interlayer insulating layers to have upper surfaces thereof lower than upper surfaces of the first and second pattern structures,
wherein a level of the upper surface of the first interlayer insulating layer is the same as a level of the upper surface of the second interlayer insulating layer,
wherein each of the first colloid and the second colloid comprises a dispersoid and a dispersion medium surrounding the dispersoid, and
wherein a material of the dispersion medium of the first colloid is the same as a material of the dispersion medium of the second colloid.

16. The method of claim 15, further comprising:
forming a third interlayer insulating layer on the upper surfaces of the first and second interlayer insulating layers,
wherein the second interlayer insulating layer has substantially the same etching rate as the first interlayer insulating layer.

17. The method of claim 15, wherein a concentration of the second colloid is lower than a concentration of the first colloid, or a thermal expansivity of the second colloid is lower than a thermal expansivity of the first colloid.

* * * * *